US010860101B1

(12) United States Patent
Menguc et al.

(10) Patent No.: US 10,860,101 B1
(45) Date of Patent: Dec. 8, 2020

(54) SYSTEMS AND METHODS USING PATTERNED NANOVOIDS FOR ACTUATION AND DEFORMATION SENSING

(71) Applicant: Facebook Technologies, LLC, Menlo Park, CA (US)

(72) Inventors: Yigit Menguc, Kirkland, WA (US); Andrew John Ouderkirk, Redmond, WA (US); Christopher Yuan Ting Liao, Seattle, WA (US); Katherine Marie Smyth, Seattle, WA (US); Thomas Wallin, Redmond, WA (US); Jack Lindsay, Seattle, WA (US); Austin Lane, Bellevue, WA (US); Tanya Malhotra, Redmond, WA (US); Ken Diest, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 43 days.

(21) Appl. No.: 16/197,396

(22) Filed: Nov. 21, 2018

(51) Int. Cl.
*H02N 2/00* (2006.01)
*G06F 3/01* (2006.01)
(Continued)

(52) U.S. Cl.
CPC ........... *G06F 3/014* (2013.01); *G02B 27/017* (2013.01); *G06F 3/016* (2013.01); *G06F 3/017* (2013.01);
(Continued)

(58) Field of Classification Search
CPC .......... G06F 3/014; G06F 3/016; G06F 3/017; G06F 3/0426; G06F 3/041; G06F 1/1652;
(Continued)

(56) References Cited

U.S. PATENT DOCUMENTS

| 6,420,441 B1 | 7/2002 | Allen et al. |
| 9,228,822 B2 | 1/2016 | Majidi et al. |

(Continued)

FOREIGN PATENT DOCUMENTS

| WO | 2014/117125 A1 | 7/2014 |
| WO | 2018/007441 A1 | 1/2018 |
| WO | 2020/106660 A3 | 7/2020 |

OTHER PUBLICATIONS

Mullin et al., "Pattern Transformation Triggered by Deformation", Physical Review Letters, vol. 99, No. 8, 084301, Aug. 22, 2007, 4 pages.
(Continued)

*Primary Examiner* — Christopher E Leiby
(74) *Attorney, Agent, or Firm* — FisherBroyles, LLP

(57) ABSTRACT

In some embodiments, an electroactive device includes a first electrode, a second electrode, and an electroactive element disposed between the first electrode and the second electrode. The electroactive element may include a plurality of voids distributed within the electroactive element. The electroactive device may have a non-uniform electroactive response based at least in part on a non-uniform distribution of voids within the electroactive element. The non-uniform electroactive response may include a non-uniform sensor response or a non-uniform actuation response. Various other methods, systems, apparatuses, and materials are also disclosed.

20 Claims, 14 Drawing Sheets

(51) Int. Cl.
  *G06F 3/042*    (2006.01)
  *G02B 27/01*    (2006.01)
(52) U.S. Cl.
  CPC .... *G06F 3/0426* (2013.01); *G02B 2027/0178* (2013.01)
(58) Field of Classification Search
  CPC ............ G02B 27/17; G02B 2027/0178; H03K 2217/96062; H01L 41/08; H01L 41/0986; H01L 41/0906; H01L 41/0926; H01L 41/193; H01L 41/0973; H01L 41/098
  See application file for complete search history.

(56) References Cited

U.S. PATENT DOCUMENTS

| | | | |
|---|---|---|---|
| 2006/0024976 | A1 | 2/2006 | Waldfried et al. |
| 2007/0263963 | A1* | 11/2007 | Hughes ............... G02B 26/0891 385/90 |
| 2008/0171431 | A1 | 7/2008 | Yu et al. |
| 2010/0075056 | A1 | 3/2010 | Axisa et al. |
| 2012/0029416 | A1 | 2/2012 | Parker et al. |
| 2012/0128960 | A1 | 5/2012 | Büsgen et al. |
| 2014/0266647 | A1* | 9/2014 | Visitacion ................. G08B 6/00 340/407.1 |
| 2016/0187985 | A1 | 6/2016 | Lim et al. |
| 2017/0090570 | A1* | 3/2017 | Rain ....................... G06F 3/016 |
| 2017/0192595 | A1 | 7/2017 | Choi et al. |
| 2018/0093456 | A1 | 4/2018 | Van Overmeere et al. |
| 2018/0181201 | A1 | 6/2018 | Grant et al. |
| 2019/0361318 | A1* | 11/2019 | Johnson ..................... G02F 1/29 |
| 2020/0076328 | A1* | 3/2020 | Cha ......................... H02N 1/006 |
| 2020/0186056 | A1* | 6/2020 | Menguc ................. H01L 41/083 |

OTHER PUBLICATIONS

Babaee et al., "3D Soft Metamaterials with Negative Poisson's Ratio", Advanced Materials, vol. 25, No. 36, Jul. 22, 2013, pp. 5044-5049.
Bertoldi et al., "Negative Poisson's Ratio Behavior Induced by an Elastic Instability", Advanced Materials, vol. 22, No. 3, Jan. 13, 2010, pp. 361-366.
Overvelde et al., "Relating pore shape to the non-linear response of periodic elastomeric structures", Journal of the Mechanics and Physics of Solids, vol. 64, Mar. 2014, pp. 351-366.
Ren et al., "Design and characterisation of a tuneable 3D buckling-induced auxetic metamaterial", Materials & Design, vol. 139, Feb. 5, 2018, pp. 336-342.
Correa et al., "Negative stiffness honeycombs for reoverable shock isolation", Rapid Prototyping Journal, vol. 21, No. 2, Mar. 16, 2015, pp. 193-200.
Coulais et al., "Discontinuous Buckling of Wide Beams and Metabeams", Physical Review Letters, vol. 115, No. 4, Jul. 21, 2015, 7 pages.
Bickel et al., "Design and Fabrication of Materials with Desired Deformation Behavior", ACM Transactions on Graphics, vol. 29, No. 4, Article 63, Jul. 1, 2010, pp. 1-10.
Rosset et al., "Small, fast, and tough: Shrinking down integrated elastomer transducers", Applied Physics Review, vol. 3, No. 3, Article 031105, Sep. 26, 2016, pp. 1-20.
Plante et al., "Large scale failure modes of dielectric elastomer actuators", International Journal of Solids and Structures, vol. 43, Mar. 29, 2006, pp. 7727-7751.
Optotune, "Electroactive Polymers", URL: https://optotune.com/technology/electroactive-polymers, retrieved on Apr. 30, 2020, 3 pages.
Novasentis, "Haptic Actuators", URL: https://novasentis.com/product, retrieved on Apr. 30, 2020, 4 pages.
Rosset et al., "Mechanical characterization of a dielectric elastomer microactuator with ion-implanted electrodes", Sensors and Actuators, A, vol. 144, No. 1, Jan. 14, 2008, pp. 185-193.
Gerratt et al., "Dielectric breakdown of PDMS thin films", Journal of Micromech and Microengineering, Technical Note, vol. 23, No. 6, Article 067001, Apr. 26, 2013, pp. 1-7.
Hunt et al., "A self-healing dielectric elastomer actuator", Applied Physics Letters, vol. 104, Article 113701, Mar. 19, 2014, pp. 1-3.
Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.
Mazurek et al., "Glycerol as high-permittivity liquid filler in dielectric silicone elastomer", Journal of Applied Polymer Science, vol. 133, No. 43, Article 44153, Jul. 20, 2016, pp. 1-8.
Rao et al., "Synthesis of flexible silica aerogels using methyltrimethoxysilane (MTMS) precursor", Journal of Colloid and Interface Science, vol. 300, No. 1, Aug. 1, 2006, pp. 279-285.
Seo et al., "Reticulated Nanoporous Polymers by Controlled Polymerization-Induced Microphase Separation", Science, vol. 336, Jun. 15, 2012, pp. 1422-1425.
Jennings, S.G., "The Mean Free Path In Air", J. Aerosol Sci., vol. 19, No. 2, Apr. 2, 1988, pp. 159-166.
Gupta et al., "Nanoemulsions: Formation, Properties, and Applications", Soft Matter, vol. 12, No. 11, Feb. 23, 2016, pp. 1-17.
Helgeson et al., "Mesoporous organohydrogels from thermogelling photocrosslinkable nanoemulsions", Nature Materials, vol. 11, Feb. 12, 2012, pp. 1-9.
Guha et al., "Creating nanoscale emulsions using condensation", Nature Communications, vol. 8, Article 1371, Nov. 8, 2017, pp. 1-7.
Meier et al., "Microemulsion elastomers", Colloid and Polymer Science, vol. 274, Mar. 1, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethoxysilane-based Silica Aerogels by Two-step Sol-gel Process", J. Microelectron. and Packaging Soc., vol. 23, No. 1, Mar. 30, 2016, pp. 35-39.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Wu et al., "3D Printed Silicones with Shape Memory", Scientific Reports, vol. 7, Article 4664, Jul. 5, 2017, pp. 1-6.
Jang et al., "Mechanically Tunable Three-Dimensional Elastomeric Network/Air Structures via Interference Lithography", Nano Letters, vol. 6, No. 4, Mar. 15, 2006, pp. 740-743.

(56) References Cited

OTHER PUBLICATIONS

Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.
Invitation to Pay Additional Fees and Partial ISR, received for PCT Application U.S. Appl. No. PCT/US2019/062098 dated Feb. 17, 2020, 11 pages.
International Search Report and Written Opinion received for PCT Application Serial No. PCT/US2019/062098 dated Jun. 25, 2020, 17 pages.

* cited by examiner

SYSTEMS AND METHODS USING PATTERNED NANOVOIDS FOR ACTUATION AND DEFORMATION SENSING

BACKGROUND

Augmented reality (AR) and virtual reality (VR) systems, which may include devices such as gloves and headsets, may enable users to experience events, such as interacting with people in a computer-generated simulation of a three-dimensional world, or viewing AR data superimposed on a real-world view. AR/VR devices may also be used for purposes other than recreation. For example, governments may use such devices for military training simulations, doctors may use such devices to practice surgery, and engineers may use such devices them as visualization aids. AR/VR devices may include sensors, transducers, or optical assemblies. Thus, there is a desire to improve such devices and systems using them.

SUMMARY

As will be described in greater detail below, some embodiments include example electroactive devices that include an electroactive element having a non-uniform distribution of voids, such that the electroactive element has a non-uniform electroactive response when an electrical signal is applied to it. Some embodiments include electroactive systems, for example including one or more electroactive devices, and some embodiments include methods, for example of sensing and/or actuation.

In some embodiments, an electroactive device may include a first electrode, a second electrode, and an electroactive element disposed between the first electrode and the second electrode. The electroactive element may include an electroactive polymer, and a plurality of voids distributed within the element polymer, for example, distributed within an electroactive polymer as a porous polymer structure. The plurality of voids may have a non-uniform distribution within the electroactive element, and the electroactive element has a non-uniform electroactive response based, at least in part, on the non-uniform distribution of voids. In some embodiments, when an electrical signal is applied between the first electrode and the second electrode, the electroactive device provides non-uniform actuation based on the non-uniform distribution of voids. In some embodiments, when a mechanical deformation is applied to a portion of the electroactive element, an electrical signal is generated between the first electrode and the second electrode, and electroactive device provides an electrical signal (which in this example may be termed a sensor signal) that depends, at least in part, on the non-uniform distribution of voids within the electroactive element. In some embodiments, an electroactive device may convert electrical energy to mechanical energy (e.g., function as an actuator), and/or may be configured to convert mechanical energy to electrical energy (e.g., function as an energy harvesting device). Examples of electroactive devices may include, without limitation, actuators, sensors, microelectromechanical devices, and/or any other suitable devices.

A non-uniform distribution of the plurality of voids may include a spatial variation in one or more of the following parameters void diameter (e.g., local average void diameter or other analogous size parameter), void volume, void number density, void volume fraction, or void orientation (e.g., in the case of anisotropic voids). Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (for example, parallel to an applied electric field), change in curvature, or other change in a dimensional parameter such as length, width, height, and the like, in one or more directions. An electroactive device may have a first deformation on application of a first voltage between the first and second electrodes, and a second deformation on application of a second voltage between the first and second electrodes, the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied root mean square (RMS) electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature. In some embodiments, an electroactive device may include an optical element mechanically coupled to the electroactive element. An optical element may include at least one of a lens, a grating, a prism, a mirror, or a diffraction grating. In some embodiments, the electroactive device may a component of a wearable device. A wearable device may include a helmet or other headware, an eyewear frame, a glove, a belt, or any device configured to be positioned adjacent to or proximate the body of a wearer, for example to support the electroactive device proximate a user when the user wears the wearable device, and the electroactive device may be configured to provide a tactile signal to the user.

In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion. The electroactive device may be a component of a wearable device, configured to be worn by a user. The wearable device is configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger.

In some embodiments, a method includes generating an electroactive response in an electroactive device, the electroactive device including an electroactive element located between a first electrode and a second electrode, wherein the electroactive response to an electrical input or a mechanical input varies appreciably over a spatial extent of the electroactive device due to a non-uniform distribution of voids within the electroactive element. In some embodiments, the electroactive response may include a mechanical response to the electrical input that varies over the spatial extent of the electroactive device, the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal may be used to determine a gesture by the user, such as a gesture including a finger movement.

In some embodiments, a method may be encoded as computer-readable instructions on a computer-readable medium. For example, a computer-readable medium may include one or more computer-executable instructions that, when executed by at least one processor of a computing device, causes an electrical signal to be applied to an electroactive device. In some embodiments, a computer-readable medium may include one or more computer-executable instructions that, when executed by at least one processor of a computing device, receives an electrical signal from an electroactive device. In some embodiments, the electroactive response to an electrical or mechanical input varies appreciably over a spatial extent of the electroactive device due to a non-uniform distribution of voids within the electroactive element. In some embodiments, the electroactive response may include a mechanical response to the electrical signal that varies over the spatial extent of the electroactive device, the electrical signal being applied between the first electrode and the second electrode. In some embodiments an electrical signal received from an electroactive device has a characteristic indicative of a location of the mechanical input to the electroactive device, or indicative of a bending angle of the electroactive device. In some embodiments, the electroactive device may be supported against a hand of a user. The control element may be configured to determine gesture data from the user, and/or provide haptic feedback to the user.

In some embodiments, an electroactive system may include one or more electroactive devices, which may be components of a wearable device. An electroactive system may include a control element, which may be an electronic circuit configured to provide actuation signals to the one or more electroactive devices. Actuation signals may be used to provide haptic signal to a person. An electroactive system may include several modules stored in memory, such as memory of the control element, including an actuation element configured to provide electroactive signals to the electroactive device, a sensor element configured to determine a configuration of a body part from electrical signals provided by an electroactive device.

Features from these and any of the other embodiments disclosed herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
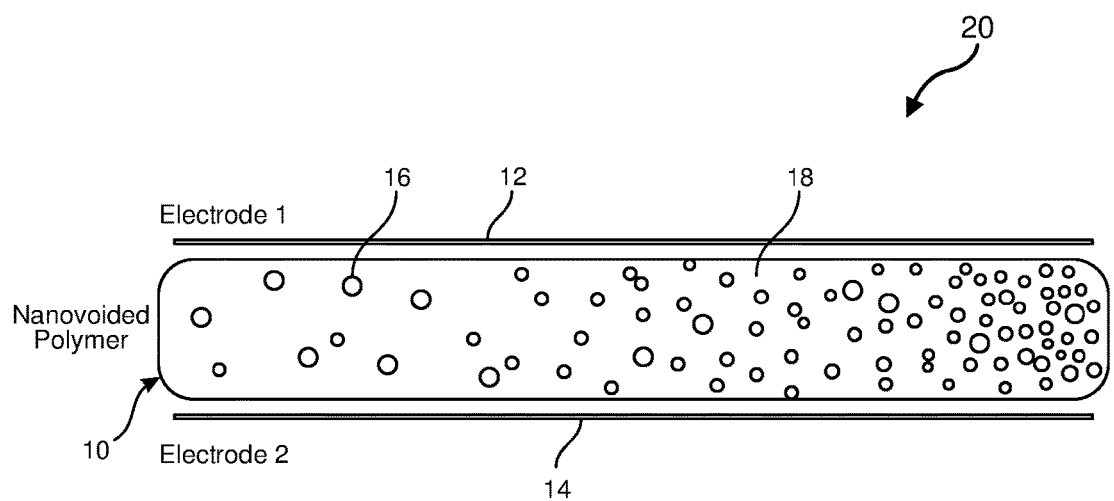
FIGS. 1A and 1B show an example electroactive device, with non-uniform actuation based at least in part on a non-uniform distribution of voids within an electroactive polymer, in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to electroactive devices, systems, and methods. As will be explained in greater detail below, embodiments of the instant disclosure may include an electroactive device, electroactive system, or method including use of an electroactive element having a non-uniform actuation response. The non-uniform actuation response may be based on a non-uniform distribution of voids within an electroactive actuator.

In some embodiments, an electroactive device may include a stack of at least two electroactive elements (e.g., electroactive elastomeric polymer elements) that are layered, with electrodes abutting opposing surfaces of each of the electroactive elements. In some embodiments, the electroactive elements may be driven by adjacent pairs of electrodes. As described below, electrodes may optionally be electrically connected to at least one adjacent common electrode extending along a lateral periphery of the stack via at least one contact layer.

An electroactive element (such as an electroactive polymer element) may deform when an electric field is applied, for example the electroactive element may compress (e.g., along a direction), elongate (e.g., along a direction), bend, change in one or more surface curvatures, and the like. Deformation may be determined by the electric field strength of the field. An electric field may be generated, for example, by placing an electroactive element between two electrodes, each of which is at a different electrical potential. As the potential difference (i.e., voltage difference) between the electrodes is increased (e.g., from zero potential) the amount of deformation may also increase, for example along of electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external. In some embodiments, an electroactive element may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In some embodiments, electroactive devices may include actuators that include electroactive polymers. In some embodiments, the electroactive devices may include a first electrode, a second electrode, and an electroactive element located between the first electrode and the second electrode. Electroactive devices based on architectures of electrodes and dielectric materials can be used for actuation as well as sensing and energy harvesting.

In some embodiments, a voltage applied to an electroactive element located between first and second electrodes creates a Maxwell stress within the electroactive element that causes flexible domains, such as dielectric domains, to change shape or relative orientation. Such devices may require high operating voltages for appreciable actuation amplitudes and there is an upper limit on performance due to breakdown voltage of the dielectric. The strain of a linearly elastic material (with no pull-in effects) may be approximated by Equation 1 below:

$$s = \frac{\varepsilon_0 \varepsilon_r}{Y}\left(\frac{V}{d}\right)^2 \quad \text{[Equation 1]}$$

Equation 1 shows that the actuation strain (s) is proportional to the relative permittivity of the dielectric material ($\varepsilon_r$) and the square of the applied voltage (V), and is inversely proportional to the Young's modulus (Y) of the dielectric material (such as an electroactive polymer, or a composite thereof) and the square of the distance (d) between the electrodes. The term $\varepsilon_0$ represents the permittivity of free space.

At higher potential differences, the electric field within the dielectric material may exceed the dielectric strength ($E_S$) of the dielectric material and the dielectric material may fail (for example undergo dielectric breakdown). For parallel electrodes spaced apart with an electrode separation distance (d), the electric field within the dielectric may be approximated as the ratio of voltage (V) to the electrode separation distance (d). The maximum actuation strain may be estimated as:

$$s_{max} = \frac{\varepsilon_0 \varepsilon_r}{Y}(E_s)^2 \quad \text{[Equation 2]}$$

Hence, actuation may be increased, operating voltages can be reduced, and energy density can be increased by reducing the effective Young's modulus (Y) of an electroactive element. Similar effects may be achieved by increasing the permittivity of the electroactive element material.

An electroactive device may be a device (e.g., including one or more electroactive elements and associated electrodes) that converts electrical energy to mechanical energy, which may be used as an actuator. An electroactive device may also convert a mechanical input into an electrical signal. An electroactive device may be used as a sensor (e.g., a sensor for movement, vibration, bending, twisting, or any user motion (such as a user input, and the like). An electrode may be formed as an electrode layer, an electrically conductive layer which may be thin and flexible. An electrode may be self-healing, meaning that if a portion of an electroactive device shorts out, the damaged area becomes electrically isolated.

An effective Young's modulus ($Y_{eff}$) may be determined for a composite electroactive element in which the Young's modulus of the material within the void is much less than the Young's modulus of the base dielectric material ($Y_{void} \ll Y_{dielectric}$). As shown in Equation 3, the effective Young's modulus is proportionally reduced by the volume fraction of voids ($\phi_{voids}$).

$$Y_{eff} = Y_{dielectric}(1-\phi_{void}) \quad \text{[Equation 3]}$$

As the volume fraction of voids is increased, the effective modulus is reduced which may in turn increase the actuation amplitude of the voided composite, holding all else constant. In some embodiments, the dielectric constant may be reduced by the presence of voids, e.g., if the voids are air filled. An electroactive element may include an electroactive polymer composite, which may include an electroactive polymer and a distribution of voids within the electroactive element. The electroactive element may further include additional components, such as particles (e.g., dielectric particles), polymer additives such as plasticizers, or other additives.

Hence, by varying the volume fraction of voids as a function of position within an electroactive element, the degree of actuation may be varied as a function of position within the electroactive element.

The following will provide, with reference to FIGS. 1-16, detailed descriptions of electroactive devices, and related systems, and methods.

Figure 1B:
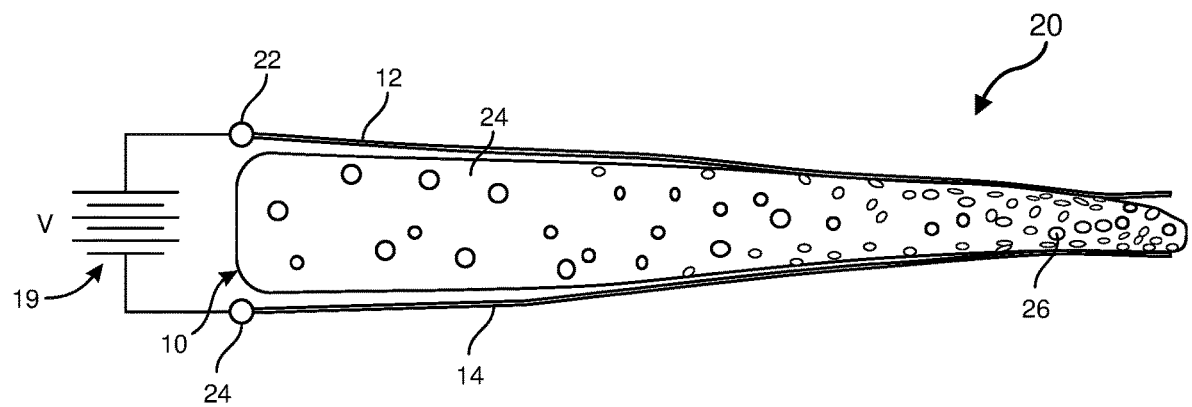

FIGS. 1A and 1B show an electroactive device 10, with non-uniform actuation based at least in part on a non-uniform distribution of voids within an electroactive element. FIG. 1A shows the electroactive device 20, including an electroactive element 10, first electrode 12, and second electrode 14. The electroactive element includes an electroactive polymer 18, having voids, such as void 16, distributed therein. In some embodiments, an electroactive device includes an electroactive polymer having a non-uniform distribution within the electroactive polymer. As shown in FIG. 1A, the volume fraction of voids generally increases from left to right within the electroactive element 10.

FIG. 1B shows an electric field applied to the electroactive device 20. A voltage, from voltage source 19, is applied to the electroactive element 10, using electrical contacts 22 and 24 to electrically communicate with electrodes 12 and 14, respectively. FIG. 1B shows the electroactive element 10 having a first portion 24 and a second portion 26. With the same voltage applied across the full extent of the electroactive element 10 by electrodes 12 and 14, the mechanical compression of the second portion 26 of the electroactive element 10 may be appreciably greater than the mechanical compression of the first portion 24 of the electroactive element 10. The degree of mechanical deformation, which may also be termed actuation, is based on, amongst other parameters, the distribution of voids throughout the electroactive element 10. In this example, a non-uniform mechanical electroactive response of the electroactive device 20 is based on the non-uniform distribution of voids, such as void 16, within the electroactive polymer 10.

Figure 2A:
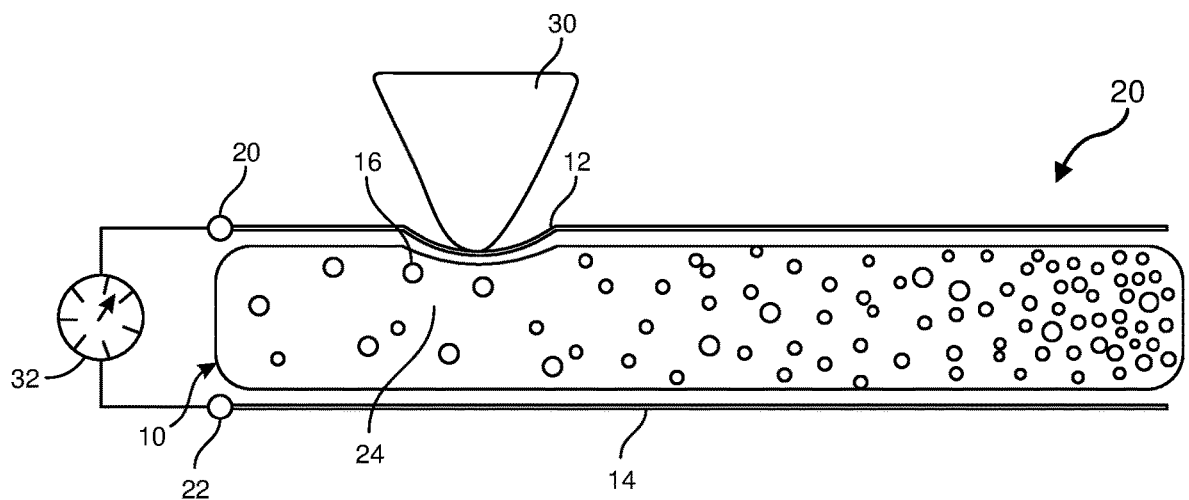
FIGS. 2A and 2B show electrical signal generation in response to a mechanical input within a first portion of an electroactive device in accordance with some embodiments.
Figure 2B:
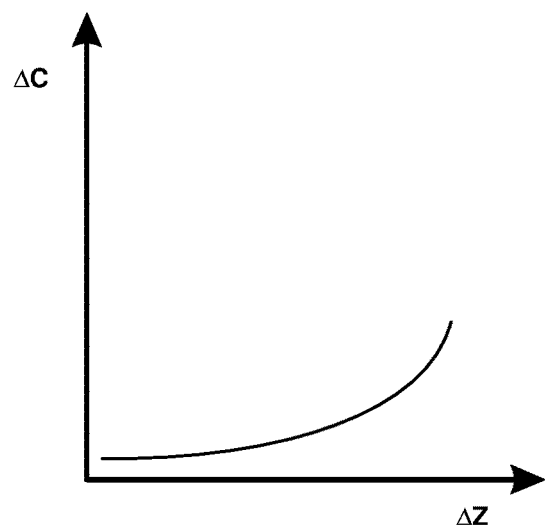

FIGS. 2A and 2B show electrical signal generation in response to a mechanical input within a first portion of an electroactive device. FIG. 2A shows an electroactive device 20, similar to that shown in FIG. 1A, including an electroactive element 10 disposed between first electrode 12 and second electrode 14. The electroactive device receives a mechanical input from pusher element 30 within a first portion 24 of the electroactive element 10. In response, the electroactive device 20 provides an electrical signal to electrical meter 32.

FIG. 2B shows an example electrical signal response (ΔC) as a function of mechanical displacement (ΔZ) in a direction normal to the electrode plane, for mechanical input within the first portion. This figure will be compared to the case of mechanical input to the second portion below.

Figure 3A:
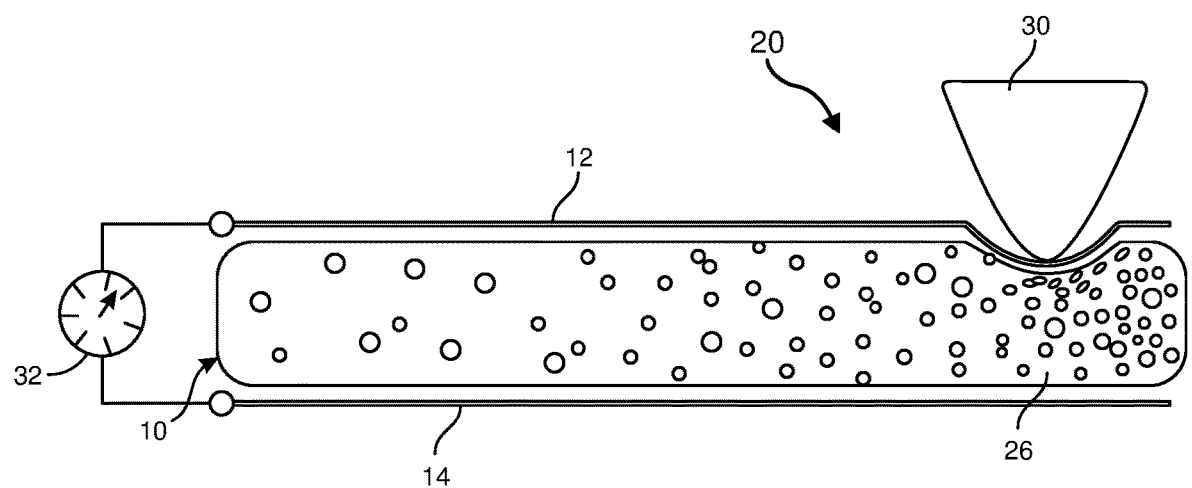
FIGS. 3A and 3B show electrical signal generation in response to a mechanical input within a second portion of an electroactive device in accordance with some embodiments.
Figure 3B:
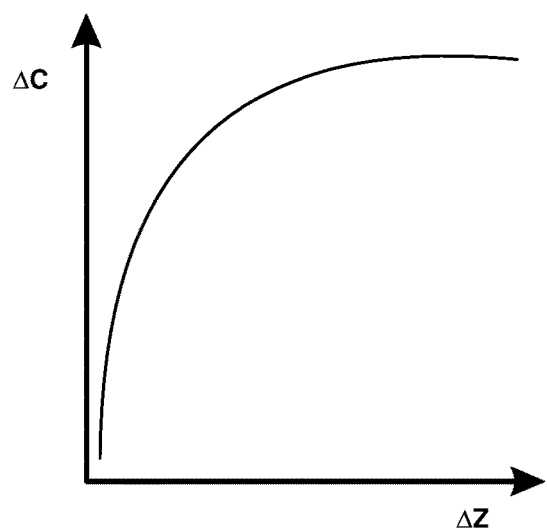

FIGS. 3A and 3B show electrical signal generation in response to a mechanical input within a second portion of an electroactive device. FIG. 3A shows an electroactive device 20, similar to that shown in FIG. 2A, having an electroactive element 20 disposed between first and second electrodes 12 and 14, respectively. In the illustrated example, the electroactive device receives a mechanical input from pusher element 30 within a second portion of the electroactive element 10. In response, the electroactive device 20 provides an electrical signal to electrical meter 32.

FIG. 3B shows a second example electrical signal response (ΔC) as a function of mechanical displacement (ΔZ) in a direction normal to the electrode plane, for mechanical input within the second portion. This figure is now compared to the electrical signal provided in response to mechanical input to the first portion, shown in FIG. 2B above. The electrical signal in response to the mechanical input is based in part on the location of the mechanical input relative to the non-uniform distribution of voids. The second portion has a greater number density of voids and a greater volume fraction of voids compared to the first portion, and therefore has lower mechanical strength. As a result, the deformation in the second portion is appreciably greater than deformation in the first portion, even for the same voltage applied across the device and with a generally uniform electrode separation in the absence of an applied voltage (e.g., as shown above in FIG. 1A). FIG. 3B shows the electrical signal is much greater, for a similar mechanical input, for a mechanical input into the second portion compared with a mechanical input located in the first portion. For relatively high mechanical inputs, the deformation of the electroactive element may tend to occur over wider portions of the electroactive elements, and the signal differences between the two cases may then be reduced.

Figure 4A:
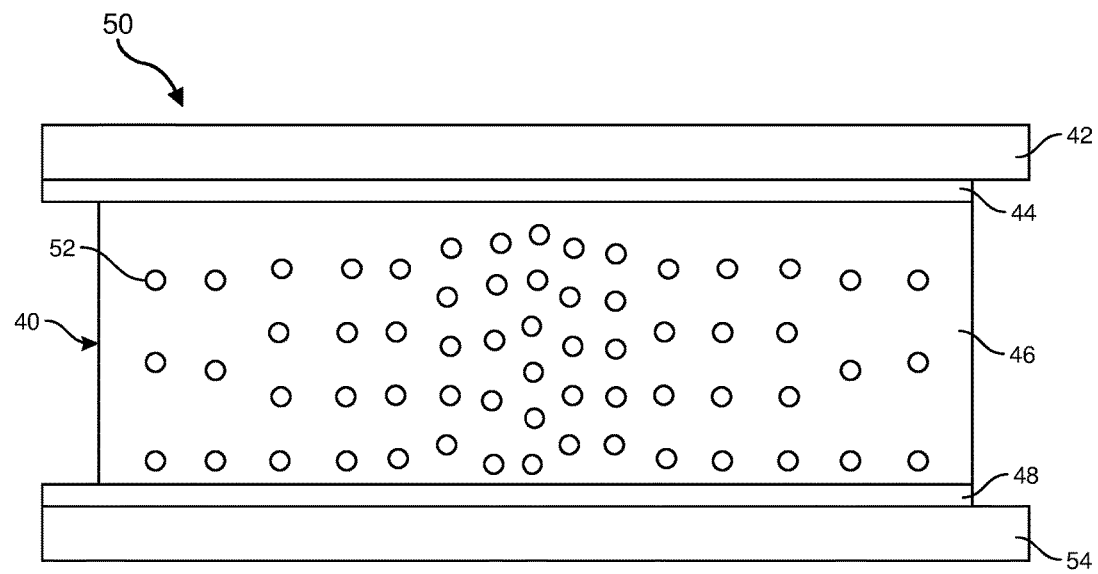
FIGS. 4A-4C show non-uniform actuation based on a non-uniform distribution of voids in accordance with some embodiments.
Figure 4B:
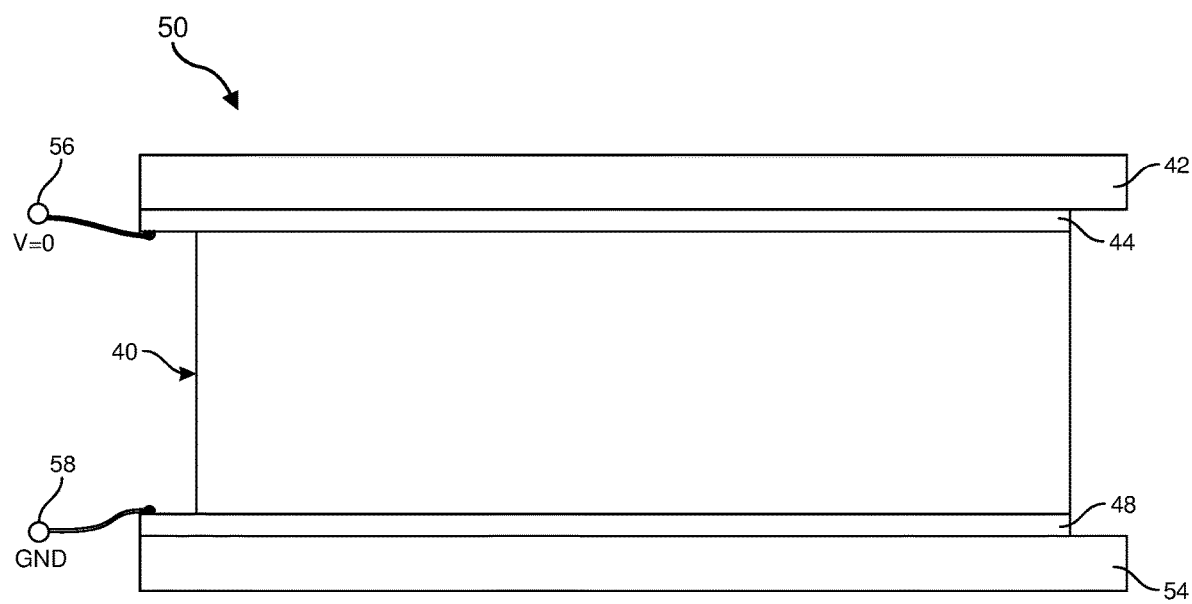
Figure 4C:
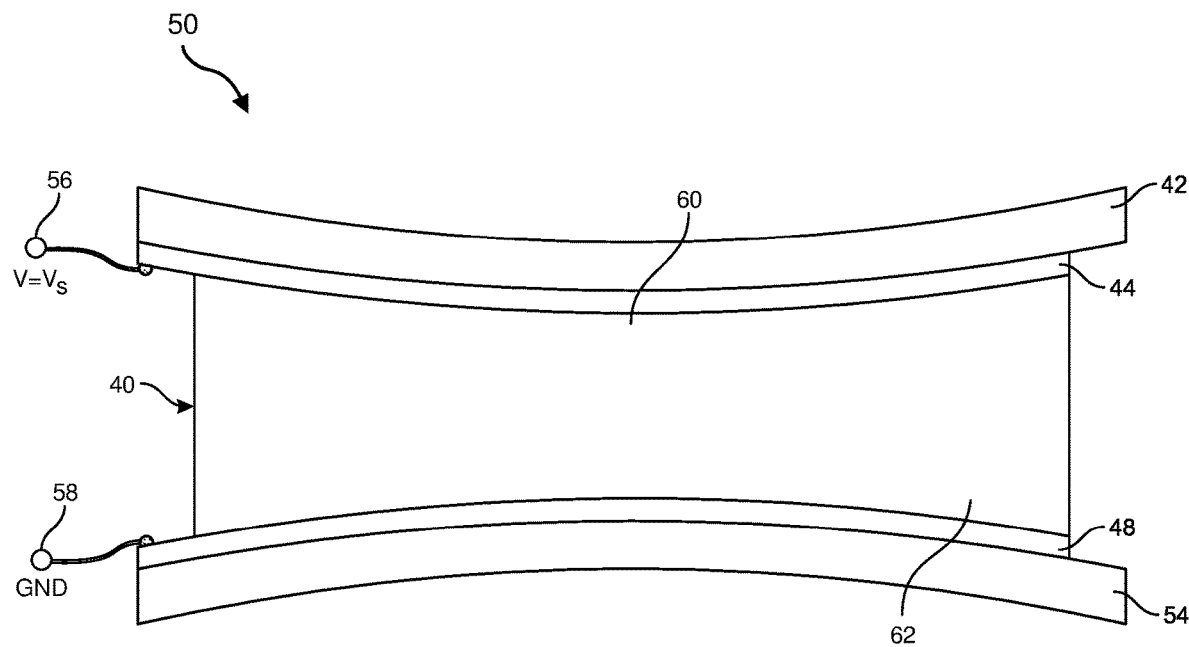

FIGS. 4A-4C show non-uniform actuation based on a non-uniform distribution of voids. FIG. 4A shows an electroactive device 50, including first substrate 42, first electrode 44, electroactive element 40 (including electroactive polymer 46 and voids such as void 52), second electrode 48 and second substrate 54. FIG. 4A shows the electroactive device with no electric field applied across the electroactive element, in this example with generally parallel first and second substrates 42 and 54, respectively, and generally parallel first and second electrodes 44 and 48, respectively. FIG. 4B shows a simplified representation, in which the void structure within the electroactive element is not shown, for illustrative simplicity. FIG. 4B shows first and second electrodes 44 and 48 electrically connected to first and second electrical contacts 56 and 58, respectively. In FIG. 4B, no electrical field is applied between the pair of electrical contacts. FIG. 4C shows electroactive device with an electrical signal applied between the first and second electrical contacts (56, 58) and hence between first and second electrodes (44 and 48). The non-uniform distribution of voids has a greater number density and volume fraction of voids within a central portion 60 of the electroactive element 40, compared with an edge portion 62. In this example, this may provide concave curvature of the substrates (42 and 54) and electrodes (44 and 48). Curvatures of each substrate/electrode combination may be similar if both substrate/electrode combinations (42/44 and 48/54) have similar mechanical properties. The curvature of a substrate may be reduced by increasing the rigidity of the substrate, and different curvatures for each substrate may be obtained if one substrate is more rigid than the other substrate.

Figure 5A:
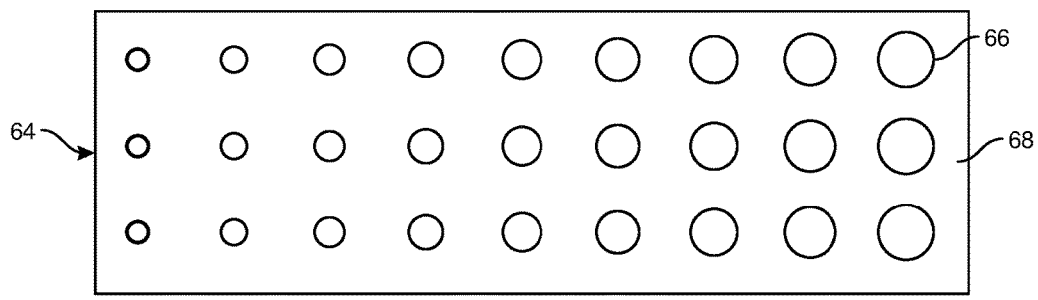
FIGS. 5A-5D illustrate example approaches to non-uniform actuation in accordance with some embodiments.

FIGS. 5A-5D illustrate example approaches to non-uniform actuation. FIG. 5A shows an electroactive element having a non-uniform distribution of voids, such as void 66, within an electroactive polymer 68. The void number density may remain similar throughout the polymer, whereas the void diameter increases from left to right as illustrated. Hence, the void volume fraction also increases from left to right. In an electroactive device, this electroactive element may provide a greater electroactive effect in portions having a higher void volume fraction, due to the reduced elastic constant of the electroactive element within such portions, compared with a reduced electroactive effect in portions having a relatively lower void volume fraction.

Figure 5B:
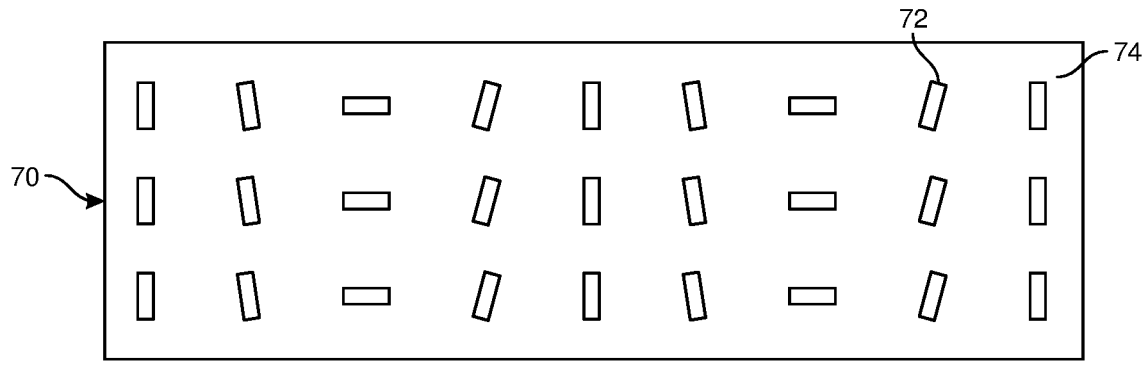

FIG. 5B shows an electroactive element 70 including anisotropic voids, such as elongated void 72. Anisotropic voids may be, for example, elongated (e.g., cigar-shaped) or disk-shaped. The void orientation may vary across the spatial extent of the electroactive element.

Figure 5C:
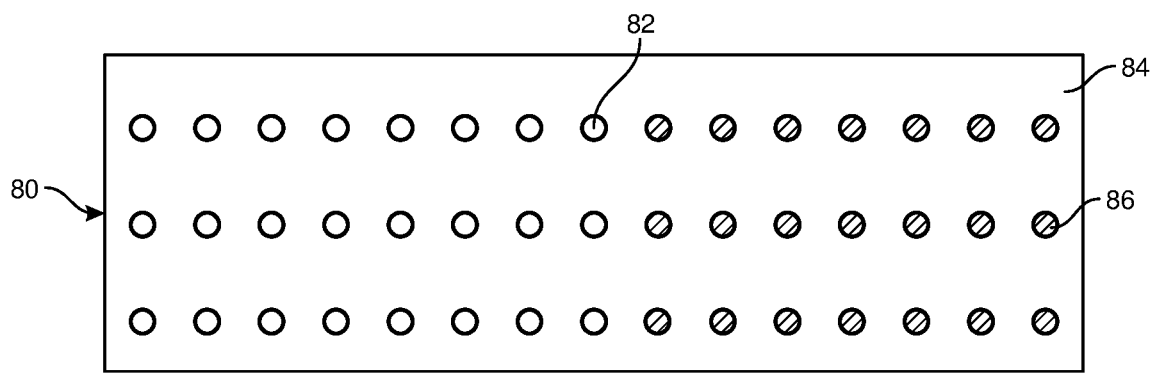

FIG. 5C shows an electroactive element 80 including voids distributed within an electroactive polymer 84. In a first portion (on the left, as illustrated) the voids (such as void 82) are filled with a relatively low dielectric material, such as air, fluorocarbon gases (e.g., 3M NOVEC 4710 insulating gas, available from 3M Company, Maplewood, Minn., USA), or any suitable gas. In a second portion (on the right, as illustrated), the voids (such as void 86) are filled with a relatively high dielectric void fill material (such as sulfur hexafluoride). In this example, a spatial variation in actuation response may be obtained using a non-uniform distribution of void fill material. The second portion, having voids filled with a higher dielectric void fill material, may show a higher electroactive effect (e.g., a larger actuation for a given applied electrical potential, or a larger electrical signal for a given mechanical input) compared with the first portion.

Figure 5D:
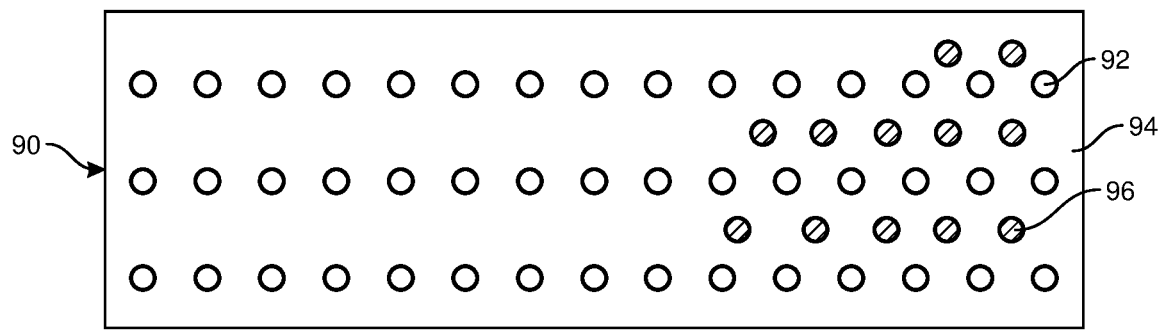

FIG. 5D shows an electroactive element including voids, such as void 90, distributed within an electroactive polymer 94. In a first portion (on the left, as illustrated) there is a generally uniform distribution of voids. The generally uniform distribution of voids extends across a second portion (on the right, as illustrated). However, the second portion further includes dielectric particles distributed within the electroactive polymer. The second portion, further including dielectric particles, may show a higher electroactive effect (e.g., a larger actuation for a given applied electrical potential, or a larger electrical signal for a given mechanical input) compared with the first portion.

Hence, a non-uniform electroactive response may be achieved using a non-uniform composition of void fill material, for example a variation in the dielectric constant of the void fill material, or a variation in the number fraction of voids filled with a particular void fill material. In some embodiments, a non-uniform electroactive response may be achieved using a non-uniform distribution of additional dielectric particles within the electroactive polymer. An electroactive element may have a non-uniform distribution in one or more of the following particle properties: dielectric constant, elastic constant, or other parameter, dielectric particle distribution (such as a variation in one or more of particle number density, particle composition, particle diameter or other size parameter), particle dielectric constant, particle orientation for anisotropic particles, or other particle parameter.

In order to obtain a non-uniform electroactive response, an electroactive element may have a non-uniform distribution of one or more of the following: void properties (such as one or more of: volume fraction; number density; diameter or other size parameter; orientation of anisotropic voids; or other void parameter), void fill material properties (as discussed above, such as one or more of: the presence or absence of a particular void fill material; dielectric constant; elastic parameter; or other void fill material parameter), electroactive polymer properties (e.g., one or more of: molecular weight; chemical composition; degree of cross-linking; volume or weight fraction of a polymer additive such as a plasticizer; dielectric constant; elastic constant; or other polymer property parameter), particle properties (such as discussed above, such as one or more of: the presence of absence of particles; particle composition; particle dielectric constant; particle diameter; or other size parameter), substrate properties (such as one or more of: rigidity; thickness; composition; or other substrate parameter), or electrode properties (such as one or more of: electrode composition; electrode stiffness; electrode resistance; electrode separation; or other electrode parameter), and/or the properties of any additional layers or materials, such as spacers.

Figure 6A:
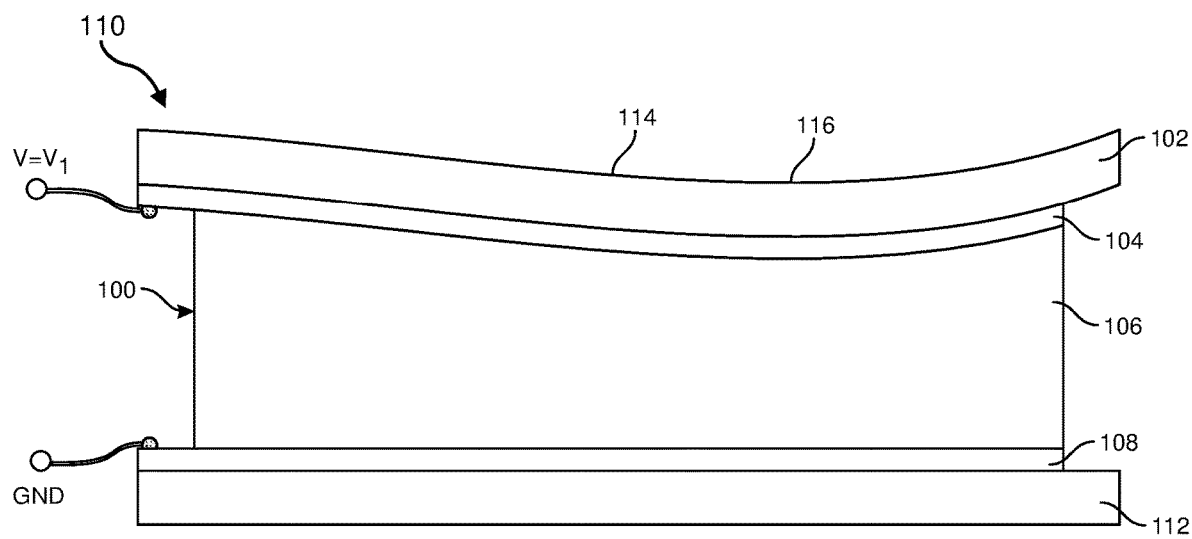
FIGS. 6A and 6B show first and second compound curves formed in response to first and second applied electric fields, respectively, in accordance with some embodiments.
Figure 6B:
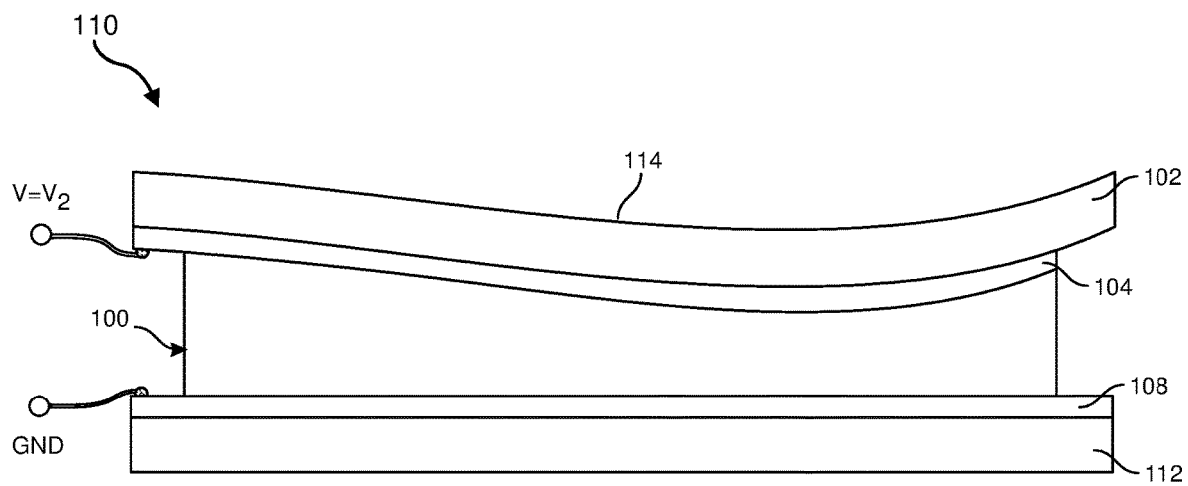

FIGS. 6A and 6B show first and second compound curves formed in response to first and second applied electric fields, respectively. FIG. 6A shows an electroactive device including a first substrate 102, first electrode 104, electroactive element 100 including an electroactive polymer composite 106 having a plurality of voids (not shown for clarity), second electrode 108, and second substrate 112. In this example, second substrate 112 is rigid, compared with the first substrate 102, so that electroconstriction (electric field induced constriction) of the electroactive element in response to first voltage $V_1$ induces mechanical deformation of the first electrode and first substrate. A plurality of voids within the electroactive element 100 has a non-uniform distribution within an electroactive polymer so that the portion of maximum deformation 116 is off-center relative to edge portions proximate the left and right edges (as illustrated) of the electroactive element 100. The upper surface 114 of the first substrate 102 presents a compound curve. A compound curve is a curved edge or surface in which the radius of curvature varies as a function of position, or otherwise has different values at different locations. In this example, the curved surface has a radius of curvature in the portion to the right of the portion of maximum deformation 116 that is less than that of the radius of curvature in the portion to the left of the portion of maximum deformation 116.

FIG. 6B shows how application of a second voltage $V_2$, in this example greater than $V_1$, induces a second compound curvature of the upper surface 114 of first substrate 102.

Figure 7:
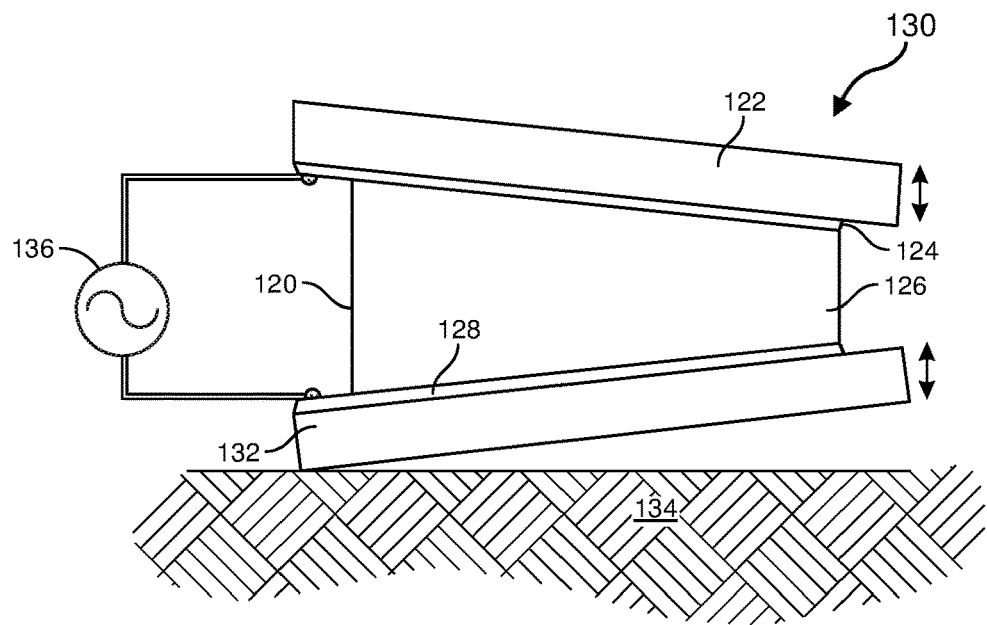
FIG. 7 shows an example electroactive device proximate the skin of a wearer, in accordance with some embodiments.

FIG. 7 shows an electroactive device proximate the skin of a wearer. Electroactive device 130 includes a first substrate 122, first electrode 124, electroactive element 120 including electroactive composite 126, second electrode 128, and second substrate 132. The second substrate may be located, at least in part, proximate, substantially adjacent, or adjacent the skin 134 of a wearer. An alternating voltage source 136 applies an alternating voltage to the electroactive device, which oscillates in response to the electrical signal. The mechanical response may correlate with the square of the applied electric field, up to a breakdown voltage, and below a cut-off frequency. In this example, electroactive element includes a non-uniform distribution of voids, such that the deformation is greatest in the right-hand portion of the device (as illustrated). In this example, application of the oscillatory electric field induces oscillation of the electroactive device to provide a tactile sensation to the skin of a wearer. Straps (e.g., belts), adhesive, suitably adapted clothing items (such gloves, headwear, or other wearable item), or other approach may be used to support the electroactive device, at least in part, proximate, substantially adjacent, or adjacent the skin 134 of a wearer.

Figure 8:
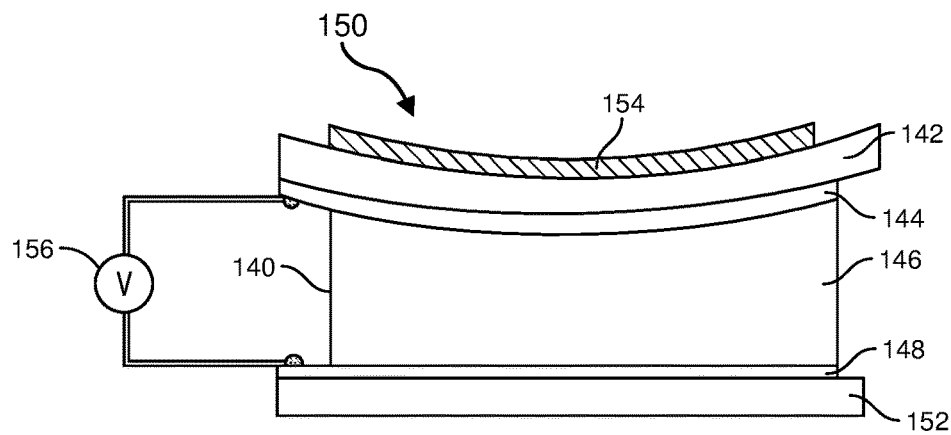
FIG. 8 shows an example electroactive device including a mirror in accordance with some embodiments.

FIG. 8 shows an electroactive device 150 including a reflective layer 154, first substrate 142, first electrode 144, electroactive element 140 including electroactive polymer composite 146, second electrode 148, and second substrate

152. A voltage source is used to apply a voltage between the first and second electrodes. The electroactive composite includes a non-uniform distribution of voids such that the deformation of the electroactive element 140 is greatest in the center, inducing a curvature in the first electrode 144, first substrate 142, and reflective layer 154. In some embodiments, an electroactive device including a reflective surface may be used as a curved mirror with an electrically-adjustable focal length. The mirror shape (e.g., circular section, parabola) and form (e.g., concave, convex, undulating, or other form) may be controlled by the form of the non-uniform distribution of voids within the electroactive element 140.

Figure 9:
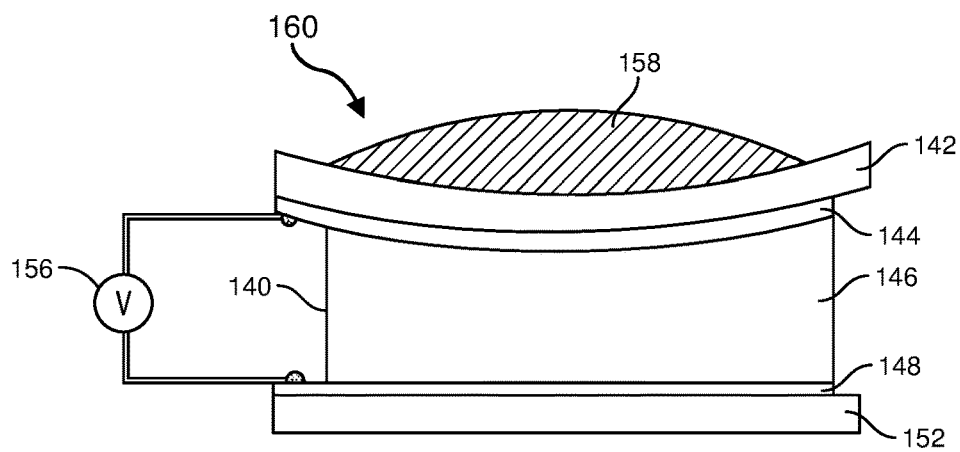
FIG. 9 shows an example electroactive device including a lens in accordance with some embodiments.

FIG. 9 shows an electroactive device 160 including a lens 158. Other aspects of the electroactive device are similar to that of FIG. 8 and will not be discussed further. Deformation of first substrate 142 changes the surface of lens 158, providing an electrically adjustable focal length lens 158. The lens may include a flexible material, such as silicone, a gel material, or other flexible optical material.

Electroactive devices may be fabricated using optically transparent or translucent materials, for example in an electroactive device including a deformable (and hence electrically-tunable) optical element, such as a lens, mirror, grating, prism, holographic element, or other optical element. In some embodiments, voids may have a size parameter (e.g., diameter) less than a light wavelength to reduce scattering. In some embodiments, voids may include a material that may be index-matched to the electroactive polymer, for example using a liquid void fill material, where the liquid has a refractive index similar (e.g., within 20%) of that of the electroactive polymer, for example under certain conditions such as a light wavelength (e.g., at least one wavelength of light that may be transmitted through the device) and temperature.

Figure 10A:
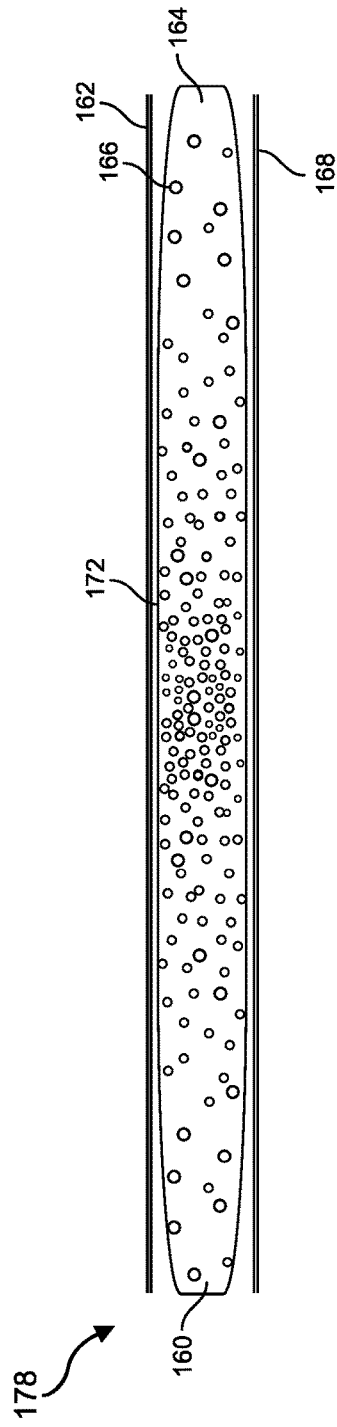
FIGS. 10A and 10B show an example electroactive device and use as a bend sensor in accordance with some embodiments.
Figure 10B:
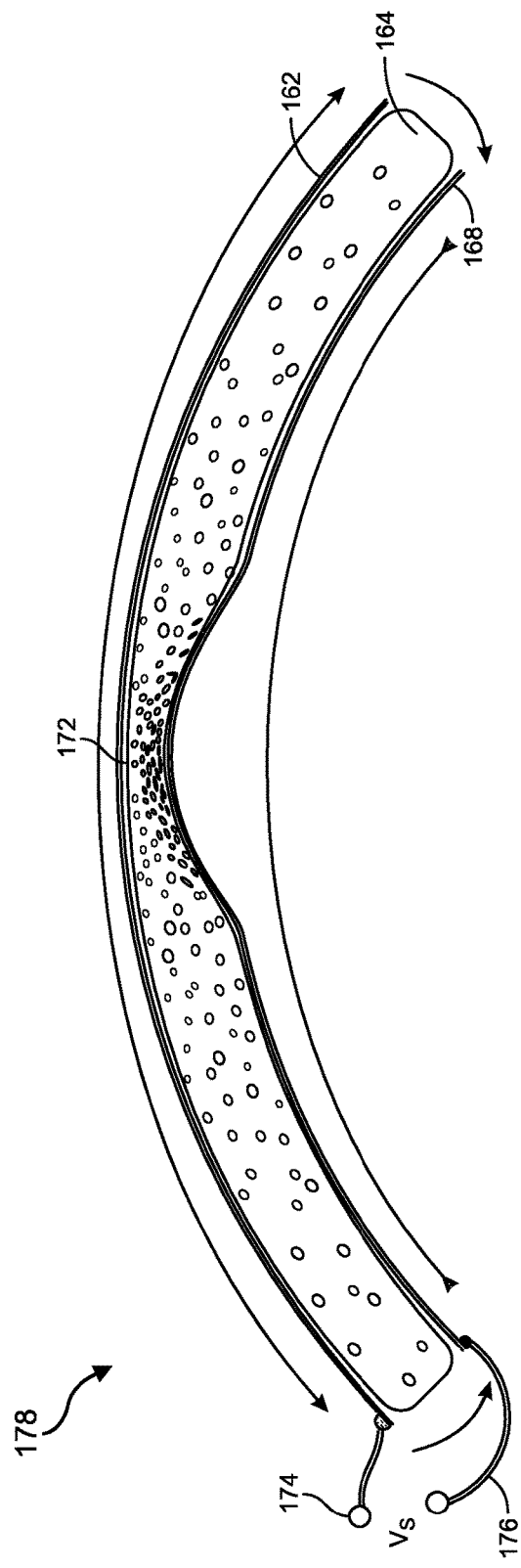

FIGS. 10A and 10B show an electroactive device and use as a bend sensor. FIG. 10A shows electroactive device 178 including first electrode 162, electroactive element 160 including voids (such as void 166) distributed through the electroactive polymer 164, and second electrode 168. The voids have a non-uniform distribution within the electroactive element 160. The electroactive element 160 has a central portion 172 with a greater number density of voids (and greater volume density of voids) than surrounding edge portions. Based on the non-uniform distribution of voids, the central portion 172 of the electroactive element has reduced rigidity, compared with surrounding edge portions.

FIG. 10B shows a bending deformation applied to electroactive device 178. The central portion 172 exhibits local void-directed buckling. The increased deformation due to the buckling deformation increases the electrical signal Vs obtained through first and second electrical connections 174 and 176, attached to first and second electrodes, respectively.

In some embodiments, an electroactive device used as an actuator may be configured in an initially bent conformation and may show electric-field induced buckling in a central (or other) portion that gives rise to an enhanced degree of actuation (for example, an enhanced degree of further bending).

Figure 11:
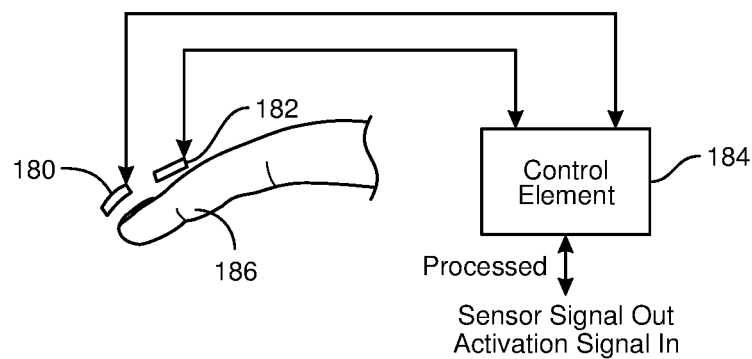
FIG. 11 shows example electroactive devices located proximate finger joints in accordance with some embodiments.

FIG. 11 shows an electroactive system including electroactive devices 180 and 182 located proximate finger joints on user finger 186. A control element 184 is used to receive electrical signals from the electroactive devices when the electroactive devices are used as sensors. The control element may output a processed sensor signal indicative of the joint angle for one or more finger joints of a user. For example, there may be signals from up to 3 joints per finger, for up to 5 fingers (the term finger may also refer to a thumb). Similarly, the processed sensor signal may also include data indicative of palm configuration, wrist configuration (e.g., bending in up to three orthogonal planes), or any other body part configuration. In some embodiments, the electroactive devices may also be used in an actuation mode, for example in response to a received actuation signal received by the control element. The control element may receive an actuation signal and provide one or more electrical signals to one or more electroactive devices in response to the actuation signal.

Figure 12:
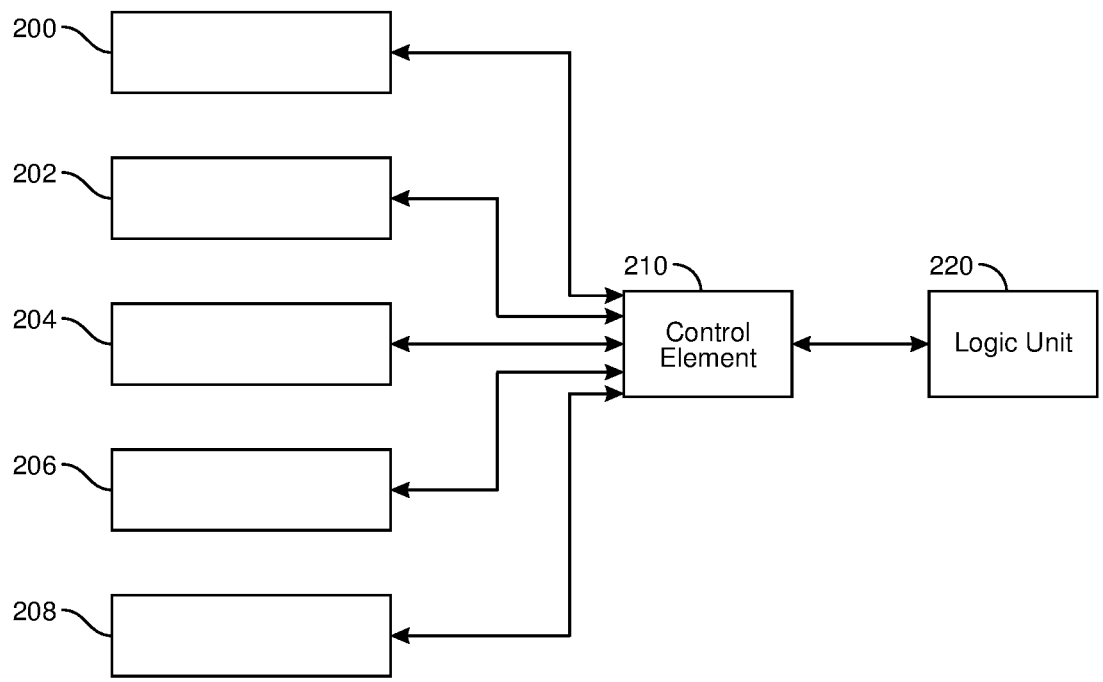
FIG. 12 shows an example control element receiving sensor signals from a plurality of electroactive devices in accordance with some embodiments.

FIG. 12 shows an electroactive system, including control element 210 receiving signals from a plurality of electroactive devices 200-208. Sensor signals from the electroactive devices may be analyzed by the control element and converted into processed sensor signals, which may contain data relating to finger positions from, for example, the fingers of one hand. Signals from the control element may be passed to a logic unit 220, which may further process the sensor data from the control element to determine, for example, a gesture by the user. A gesture may include a data input (e.g., pressing a key of a virtual keyboard), other alphanumeric input, other character and/or symbol input, control of a virtual mouse, trackball, or other data input device.

Figure 13:
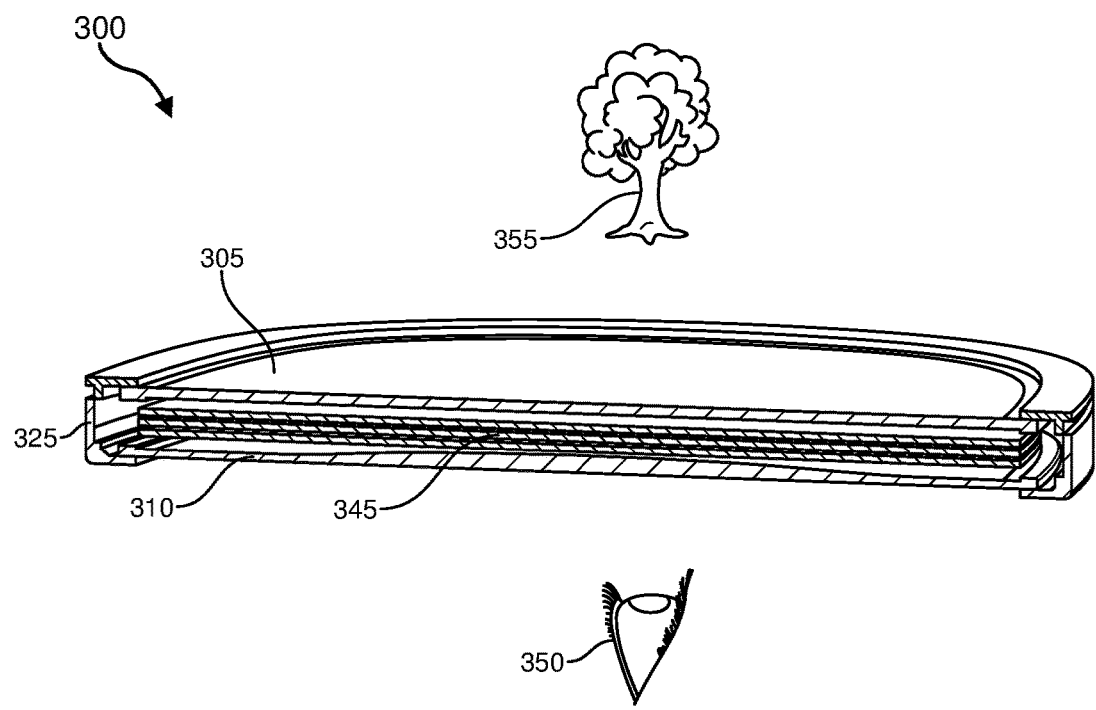
FIG. 13 shows an example lens used within an AR/VR device in accordance with some embodiments.

FIG. 13 shows a lens used within an AR/VR device. FIG. 13 illustrates a cross-section of a lens-display assembly 300, in accordance with at least one embodiment. As shown in FIG. 13, lens-display assembly 300 may include an adjustable lens 305, an adjustable lens 310, a display 345 positioned between adjustable lenses 305 and 310, and a lens assembly housing 325. In some embodiments, the volume between lens assembly housing 325 and display 345 may provide space for electroactive devices (e.g., actuators) as described herein. According to some embodiments, the combination of adjustable lenses 305 and 310 may modify the apparent accommodation distance of images created by display 345 without changing the appearance of distant real-world objects (e.g., tree 355) as perceived by a user's eye.

Figure 14:
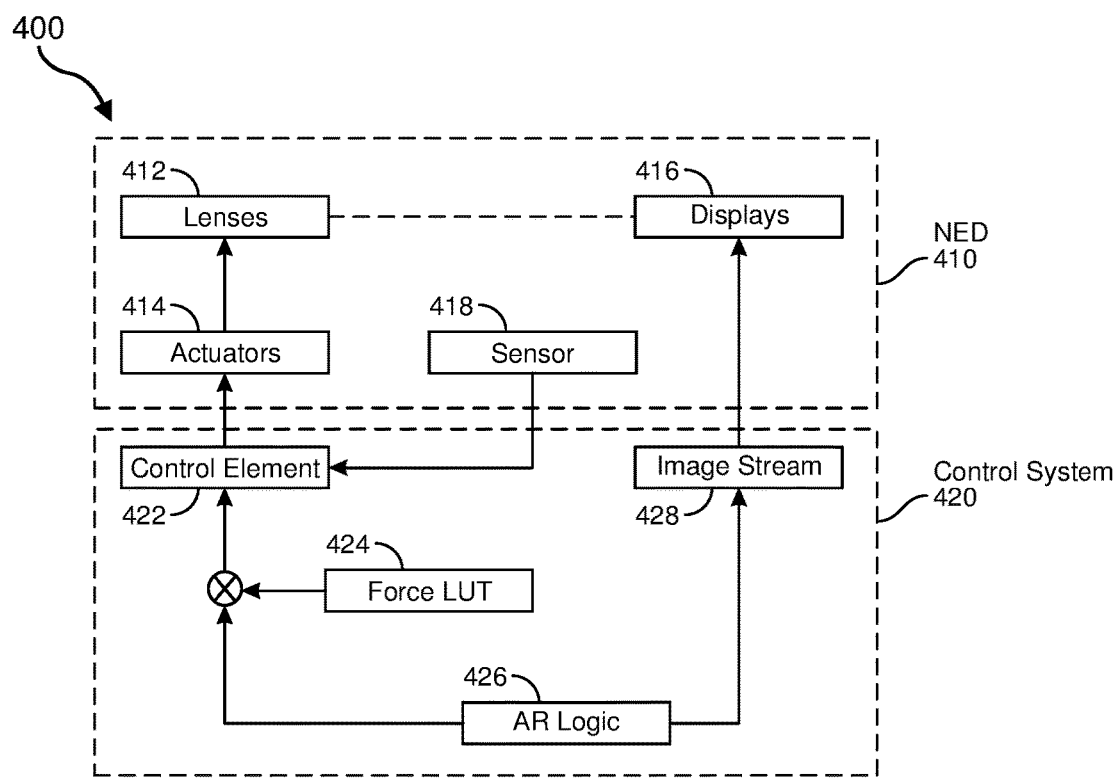
FIG. 14 shows an example electroactive system in accordance with some embodiments.

FIG. 14 shows a near-eye display system 400 includes a near-eye display (NED) 410 and a control system 420, which may be communicatively coupled to each other. The near-eye display 410 may include lenses 412, electroactive devices (e.g., actuators) 414, displays 416, and a sensor 418. Control system 420 may include a control element 422, a force lookup table 424, and augmented reality (AR) logic 426.

Augmented reality logic 426 may determine what virtual objects are to be displayed and real-world positions onto which the virtual objects are to be projected. Accordingly, augmented reality logic 426 may generate an image stream 428 that is displayed by displays 416 in such a way that alignment of right- and left-side images displayed in displays 416 results in ocular vergence toward a desired real-world position.

Control element 422 may use the same positioning information determined by augmented reality logic 426, in combination with force lookup table (LUT) 424, to determine an amount of force to be applied by electroactive devices 414 (e.g., actuators), as described herein, to lenses 412. Electroactive devices 414 may, responsive to control element 422, apply appropriate forces to lenses 412 to adjust the apparent accommodation distance of virtual images displayed in displays 416 to match the apparent vergence distance of the virtual images, thereby reducing or eliminating vergence-accommodation conflict. Control element 422 may be in communication with sensor 418, which may measure a state of the adjustable lens. Based on data received from sensor 418, the control element 422 may adjust electroactive devices 414 (e.g., as a closed-loop control system).

In some embodiments, display system 400 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 422 to enable control element 422 to select the position of the relevant virtual object.

Additionally or alternatively, augmented reality logic 426 may provide information about which virtual object is the most important and/or most likely to draw the attention of the user (e.g., based on spatial or temporal proximity, movement, and/or a semantic importance metric attached to the virtual object). In some embodiments, the augmented reality logic 426 may identify multiple potentially important virtual objects and select an apparent accommodation distance that approximates the virtual distance of a group of the potentially important virtual objects.

Control system 420 may represent any suitable hardware, software, or combination thereof for managing adjustments to adjustable lenses 412. In some embodiments, control system 420 may represent a system on a chip (SOC). As such, one or more portions of control system 420 may include one or more hardware modules. Additionally or alternatively, one or more portions of control system 420 may include one or more software modules that perform one or more of the tasks described herein when stored in the memory of a computing device and executed by a hardware processor of the computing device.

Control system 420 may generally represent any suitable system for providing display data, augmented reality data, and/or augmented reality logic for a head-mounted display. In some embodiments, control system 420 may include a graphics processing unit (GPU) and/or any other type of hardware accelerator designed to optimize graphics processing.

Figure 15:
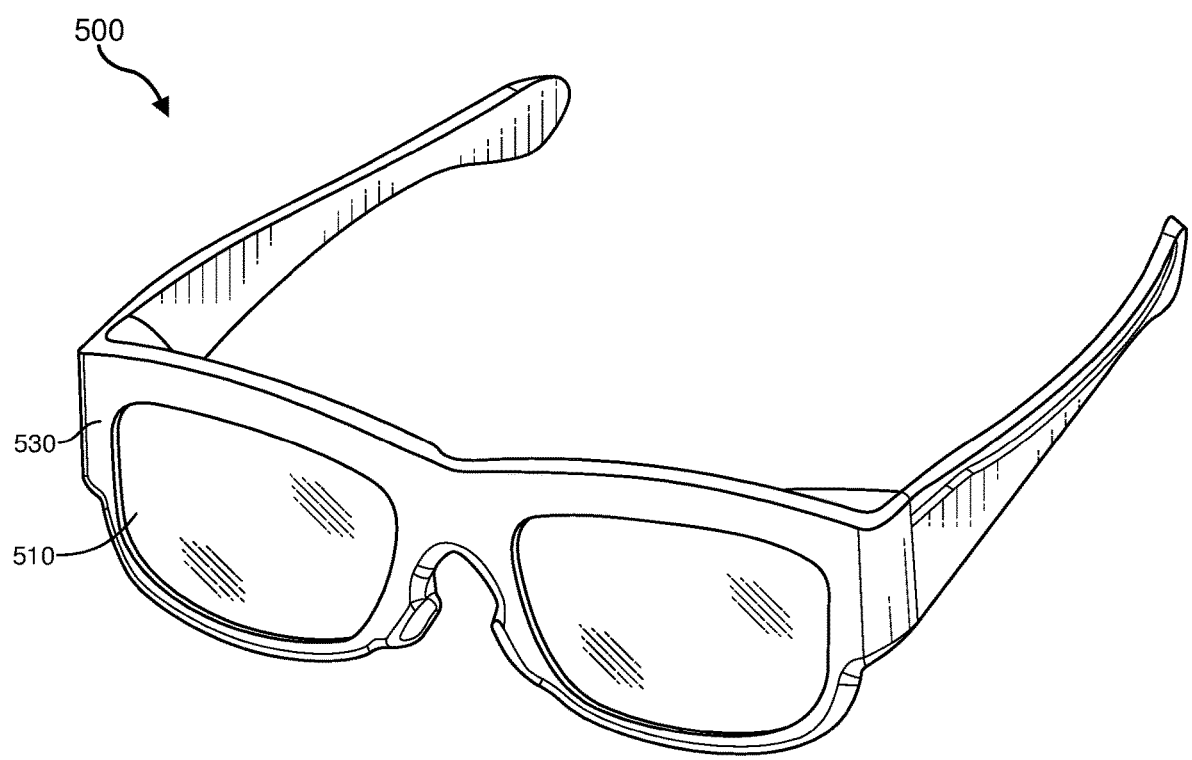
FIG. 15 shows an example head-mounted display in accordance with some embodiments.

FIG. 15 shows augmented reality glasses 500. The control system 420 described above may be implemented in a system such as the augmented reality glasses 500 illustrated in FIG. 15. As shown, glasses 500 may include adjustable-focus lenses 510 coupled to a frame 530 (e.g., at an eyewire, not shown). In some embodiments, control system 420 of FIG. 8 may be integrated into frame 530. Alternatively, all or a portion of control system 420 may be in a system remote from glasses 500 and configured to control electroactive devices (e.g., actuators) in glasses 500 via wired or wireless communication.

In some embodiments, each of lenses 510 may include, for example, an optical fluid encapsulated by an elastomeric membrane and an optically clear and rigid back substrate. Actuation along the perimeter of lenses 510 (e.g., using one or more electroactive devices as further shown and described in connection with embodiments herein) may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface may be non-planar when a substrate is curved.

Electroactive devices (e.g., actuators) mounted in frame 530 (e.g., in an eyewire) may deform each lens, with high optical quality achieved through tailored displacement and deflection, and via perimeter mounting for an asymmetric clear aperture including, for example, an RGB (red-green-blue) waveguide.

As noted, control system 420 of FIG. 8 may trigger electroactive devices to adjust lenses (e.g., lenses 510) to help address the vergence-accommodation conflict. The vergence-accommodation conflict may result from how humans perceive depth. When a human eye fixates on an object, it accommodates to that object—that is, it changes focal distance to bring that object into focus. That accommodation is a visual cue to depth: objects that are much closer or further away than that distance are out of focus on the retina. This "retinal blur" is a cue that objects are at a different distance than the accommodative distance, although the cue is ambiguous as to whether the objects are closer or more distant.

When both eyes are used (stereoscopically), binocular disparity is the main visual cue for depth. The two eyes look at an object from slightly different angles, so they get slightly different views of the object. This difference in views is the binocular disparity (imperfect match) between the two views. The visual system normally fuses these two images into a single perception and converts the disparity between the two images into a perception of depth. The closer an object is, the larger the disparity (error in matching) between the images it produces on the two retinas.

In a typical virtual reality head-mounted device, a virtual display plane, or focal plane, may be located at a fixed distance. But virtual objects may be "located" either in front of or behind the focal plane. The head-mounted display may try to reproduce binocular disparity for such virtual objects, which is the main visual cue for depth. But the binocular disparity cue may drive the eyes to verge at one distance, while the light rays coming from the virtual plane may produce retinal blur that drives the eyes to accommodate to another distance, creating a conflict between those depth cues and forcing the viewer's brain to unnaturally adapt to conflicting cues. This vergence-accommodation conflict, in turn, creates visual fatigue, especially during prolonged use of an augmented reality system.

Figure 16:
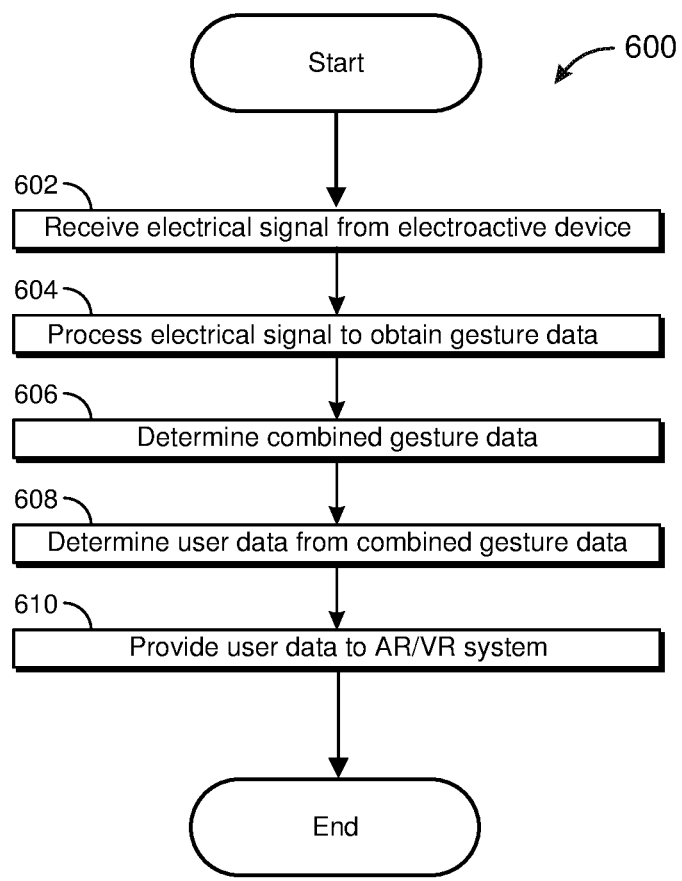
FIG. 16 illustrates a flow diagram of an example computer-implemented method of using an electroactive device to obtain and utilize user gesture data in accordance with some embodiments.

FIG. 16 is a flow diagram of an exemplary computer-implemented method 600. In some embodiments, a computer-implemented method includes receiving an electrical signal from an electroactive device and determining a user gesture input, such as a finger motion, item selection, keyboard input, or other input. In FIG. 16, step 602 corresponds to receiving (e.g., by a control element, such as a processor-based device such as a computer device) an electrical signal from an electroactive device. Step 604 corresponds to processing (e.g., by a control element) the electrical signal, to provide gesture data including one or more gesture parameters. A gesture parameter may include a finger joint bend angle, a palm bend, a wrist bend, hand position, or other hand configuration parameter. Step 606 corresponds to combining the processed gesture data with any other gesture data (such as video camera data, accelerometer data, or any other sensor signal data source(s)) to provide combined gesture data. Step 608 corresponds to determining (e.g., by the control element, or a logic unit in communication with the control element) user data from the combined gesture data. Step 610 corresponds to providing the user data to an AR/VR system, for example as user input data. For example, gesture data in the form of keyboard typing gesture parameters may be determined from the combined gesture data, and used to provide user data, in the form of a typed key input, into an AR/VR system.

Other sensor data that may be used in the determination of combined gesture data may include other gesture data from other electroactive devices. Gesture data may include one or more of the following: a magnitude of a deformation, a location of a deformation, a bend angle, or a gesture type (e.g., selected from a plurality of gesture types). The analysis of the electrical signal may be based on a non-uniform distribution of voids within an electroactive element of the electroactive device. In some embodiments, a non-transitory computer-readable medium includes one or more computer-executable instructions that, when executed by at least one processor of a control element (such as a computer device) causes the control element to send an electrical signal to an electroactive device to obtain a non-uniform actuation, wherein the non-uniform actuation is based, at least in part, on a non-uniform distribution of voids within an electroactive element of the electroactive device.

Figure 17:
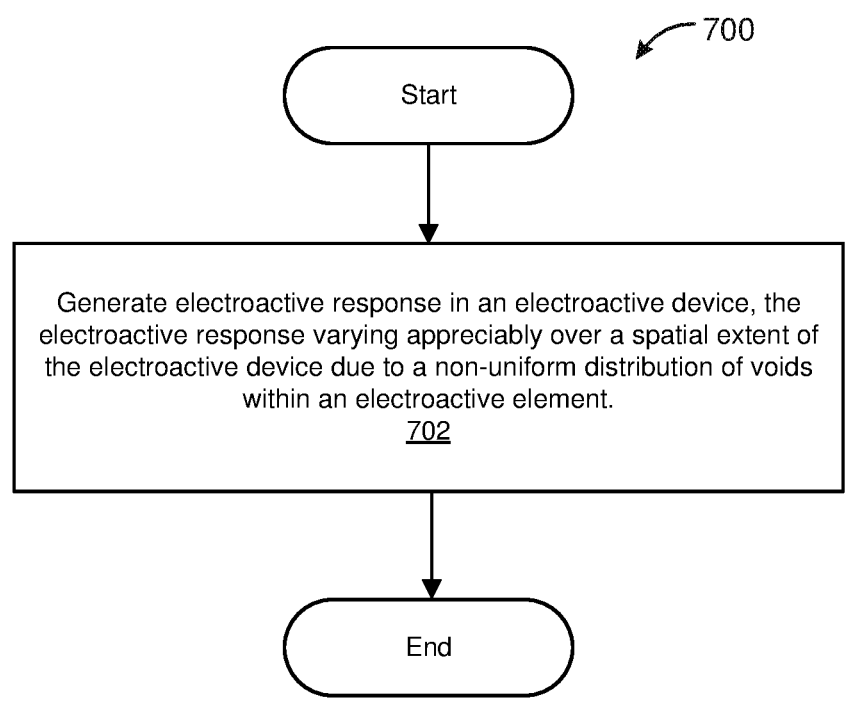
FIG. 17 shows a flow diagram of an example method of operating an electroactive device in accordance with some embodiments.

FIG. 17 shows a flow diagram illustrating an example method 700 of operating an electroactive device, in accordance with some embodiments of the disclosure. In accordance with various embodiments described herein, at step 702, an electroactive response may be generated in an electroactive device, the electroactive device including an electroactive element located between a first electrode and a second electrode (see, e.g., FIGS. 1A-16). The electroactive response to an electrical input or a mechanical input may vary appreciably over a spatial extent of the electroactive device due to a non-uniform distribution of voids within the electroactive element (see, e.g., FIGS. 1A, 1B, 2A, 3A, 4A, 5A-5D, 10A, and 10B).

In some embodiments, the electroactive response may include a mechanical response to the electrical input that varies over the spatial extent of the electroactive device, the electrical input being applied between the first electrode and the second electrode (see, e.g., FIGS. 1A, 1B, 4A-4C, 6A-10B, and 13-15). In additional embodiments, the electroactive response may include an electrical signal having a characteristic indicative of a location of the mechanical input to the electroactive device, the electrical signal being measured between the first electrode and the second electrode (see, e.g., FIGS. 2A-3B, 11, and 12). In at least one embodiment, the electroactive device may be supported against a hand of a user and/or against any other suitable portion of the user's body. The electrical signal may then be used to determine a gesture by the user, the gesture including a finger movement and/or other bodily movement (see, e.g., FIGS. 7, 11, and 12).

The methods shown in FIGS. 16 and 17 may be performed by any suitable computer-executable code and/or computing system, including the system illustrated in FIG. 12, or the system shown in FIG. 14. In one example, one or more of the steps shown in FIGS. 16 and 17 may represent an algorithm whose structure includes and/or is represented by multiple sub-steps. A system that may perform, for example, the computer-implemented method of FIG. 16 and/or FIG. 17 may include at least one electroactive device, a control element, and a logic unit. An example system is discussed above in relation to FIG. 12 or FIG. 14.

In some embodiments, an electroactive device includes a first electrode, a second electrode, and an electroactive element disposed between the first electrode and the second electrode. The electroactive element may include an electroactive polymer and a plurality of voids distributed within the electroactive polymer, for example as a porous polymer structure. Voids may be generally isolated from each other, or, at least in part, be interconnected through an open-cell structure. The plurality of voids may have a non-uniform distribution within the electroactive polymer, and the electroactive element may have a non-uniform electroactive response when an electrical signal is applied between the first electrode and the second electrode, based on the non-uniform distribution of voids.

A non-uniform distribution of the plurality of voids may include a spatial variation in at least one of void diameter, void volume, void number density, void volume fraction, or void orientation (e.g., in the case of anisotropic voids. Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (for example, parallel to an applied electric field), change in curvature, or other change in a dimensional parameter such as length, width, height, and the like, in one or more directions. An electroactive device may have a first deformation on application of a first voltage between the first and second electrodes, and a second deformation on application of a second voltage between the first and second electrodes, the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature.

In some embodiments, an electroactive device may include an optical element mechanically coupled to the electroactive element. An optical element may include at least one of a lens, a grating, a prism, a mirror, or a diffraction grating. In some embodiments, the electroactive device may a component of a wearable device. The wearable device may include a helmet or other headwear, an eyewear frame, a glove, a belt, or any device configured to be positioned adjacent to or proximate the body of a wearer, for example to support the electroactive device proximate a user when the user wears the wearable device, and the electroactive device may be configured to provide a tactile signal to the user. In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion.

The electroactive device may be a component of a wearable device, configured to be worn by a user. The wearable device is configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger. In some embodiments, a method includes generating an electroactive response in an electroactive device, the electroactive device including an electroactive element located between a first electrode and a second electrode, wherein the electroactive response to an electrical input or a mechanical input varies appreciably over a spatial extent of the electroactive device due to a non-uniform distribution of voids within the electroactive element.

In some embodiments, the electroactive response may include a mechanical response to the electrical input that varies over the spatial extent of the electroactive device, the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal is used to determine a gesture by the user, the gesture including a finger movement. In some embodiments, typing inputs by a user, e.g., into a virtual keyboard, may be determined from sensor signals.

In some embodiments, an electroactive device may include one or more electroactive elements, and an electroactive element may include one or more electroactive materials, which may include one or more electroactive polymer materials. In various embodiments, an electroactive device may include a first electrode, a second electrode overlapping at least a portion of the first electrode, and an electroactive element disposed between the first electrode and the second electrode. In some embodiments, the electroactive element may include an electroactive polymer. In some embodiments, an electroactive element may include an elastomer material, which may be a polymer elastomeric material. In some embodiments, the elastomer material may have a Poisson's ratio of approximately 0.35 or less. The electroactive element may be deformable from an initial state to a deformed state when a first voltage is applied between the first electrode and the second electrode, and may further be deformable to a second deformed state when a second voltage is applied between the first electrode and the second electrode.

In some embodiments, there may be one or more additional electrodes, and a common electrode may be electrically coupled to one or more of the additional electrodes. For example, electrodes and electroactive elements may be disposed in a stacked configuration, with a first common electrode coupled to a first plurality of electrodes, and a second common electrode electrically connected to a second plurality of electrodes. The first and second pluralities may alternate in a stacked configuration, so that each electroactive element is located between one of the first plurality of electrodes and one of the second plurality of electrodes.

In some embodiments, an electroactive element may have a maximum thickness in an undeformed state and a compressed thickness in a deformed state. In some embodiments, an electroactive element may have a density in an undeformed state that is approximately 90% or less of a density of the electroactive element in the deformed state. In some embodiments, an electroactive element may exhibit a strain of at least approximately 10% when a voltage is applied between the first electrode and the second electrode.

In some embodiments, an electroactive element may include at least one non-polymeric component in a plurality of defined regions, and the method may further include removing at least a portion of the at least one non-polymeric component from the cured elastomer material to form a nanovoided polymer material.

In some embodiments, an electroactive device includes an electroactive polymer configured with a first location of patterned nanovoids such that the first location has a different transduction behavior from a second location having a second location of patterned nanovoids. In some embodiments, a global electric field applied over the entirety of an electroactive element generates differential deformation between the first and second locations. An electroactive element may have a plurality of locations of patterned nanovoids such that when a first voltage is applied the EAP exhibits a predetermined compound curvature. The electroactive device may exhibit a second predetermined compound curvature, different from the first predetermined compound curvature, when a second voltage is applied. A wearable device may include an electroactive device, wherein the first compound curvature provides a first tactile feeling and the second compound curvature provides a second tactile feeling to a person when the person is wearing the wearable device. In some electrodes, the first electrode and/or the second electrode may be patterned, allowing a localized electric field to be applied to a portion of the device, for example, to provide a localized compound curvature.

In some embodiments, a sensor includes an electroactive device, where the electroactive device includes a first and a second portion, where the first portion has a different sensor response than the second portion due to a non-uniform distribution of patterned nanovoids. The sensor may be a wearable device. The sensor may be in electrical communication with a controller configured to determine a flexure of a wearable device based on the one or more electrical outputs from the wearable device. For example, the wearable device may include one or more electroactive devices configured as sensors. In some embodiments, a sensor may be configured to determine a joint position of a wearer of the sensor based on the one or more electrical signals from the sensor. The sensors may be part of a glove or other wearable device. In some embodiments, the sensor may include an arrangement of electroactive sensors and may be configured to determine keystrokes into a keyboard, where the keyboard may be a real or virtual keyboard.

A non-uniform distribution of voids within an electroactive element may include a functional dependence on a distance parameter, such as distance from an edge and/or center of an electroactive element. For example, an electroactive element may have a generally rectangular shape with a generally uniform thickness. In some embodiments, the volume fraction of voids may increase monotonically along a direction parallel to a longer side and/or a shorter side of the rectangular shape. In some examples, the void volume fraction may have a highest value in some portion of the electroactive element and decrease from the highest portion to portions with lower void volume fractions elsewhere, for example proximate an edge. In some examples, the void volume fraction may have a lowest value in some portion of the electroactive element and increase from the lowest portion to portions with higher void volume fractions elsewhere, for example proximate an edge of the electroactive element. In some examples, an electroactive element may have a generally disk shape. The volume fraction of voids may vary as a function of a radial distance from the disk center. In some embodiments, the volume fraction may be highest in a central portion of a disk-shaped electroactive element and decrease along a radial direction to an edge. In some embodiments, the volume fraction may be lowest in a central portion and increase along a radial direction to an edge. The variation in void volume fraction may have a functional relationship with a distance parameter, for example including one or more of a linear, quadratic, sinusoidal, undulating, parabolic, or other functional relationship with a distance parameter along one or more of the relevant distance parameters. For example, a distance parameter may be determined as the distance along an edge, obliquely across, from a center, or other distance measurement for a given electroactive element.

An electroactive element can convert deformations into electrical signals, such as proportional electrical signals that scale with a deformation parameter (such as applied pressure). An electroactive element may also receive an electrical signal that induces a deformation based on the electrical signal (for example, based on the voltage squared or mean square voltage). An electroactive device may be a transducer, with a degree of deformation based on the electrical signal, and/or as a sensor providing an electrical signal based on a degree of deformation. The electroactive response is mediated by the dielectric constant and elastic modulus of the electroactive element. Using a single homogeneous polymer film constrains the transducer response to a particular input electrical signal/output mechanical response across the device. In some embodiments, an electroactive device actuates and/or senses deformations as a function of position within a single device, without the need for complex electrode structures, facilitating electroactive devices (such as transducers and/or sensors) capable of spatially variable actuation and sensing responses, using a simple electrical architecture such as a pair of electrodes.

In some embodiments, a device includes a transducer that converts variations in a physical quantity into an electrical signal, and/or vice versa. In some embodiments, the electrical response of a transducer may be correlated with a location of a mechanical input. The process by which variations in a physical quantity transforms into an electrical signal, and/or vice versa, may be referred to as transduction. A transducer may include an electroactive element, such an electroactive polymer element. In some examples, an electroactive element may include an electroactive polymer with a distribution of voids formed therein.

In some embodiments, an electroactive element may include a distribution of voids. In some embodiments, a void may include a region filled with a different medium, such as a non-polymeric material, such as a gas such as air, or a liquid. A portion of the electroactive element may have a volume fraction of voids, which may be determined as the void volume within a portion of the electroactive element divided by the total volume of the portion of the electroactive element. In some embodiments, the void volume fraction may be a function of a distance parameter. For example, the void volume fraction may be a linear function of a distance from one edge of an electroactive element, for example increasing in a generally linear fashion from one side to another. In some examples, the volume void fraction may be a non-linear function of a distance parameter, such as a polynomial function (such as a quadratic function), a step function, a parabolic function, an undulating function, a sine function, or the like. A distance parameter may be a distance from an edge of an electroactive element. In some embodiments, an electroactive element may have a generally cuboid shape, for example having a length, width, and thickness, for example as determined along generally mutually orthogonal directions. The thickness of the electroactive element may be approximately equal to the electrode separation. In some embodiments, an electroactive element may have a disk shape, a wedge shape, an elongated form such as a rod, or other shape. A distance parameter may be (as appropriate) a distance along an edge (e.g., a distance from one side towards another side), a radial distance (e.g., a distance from a center or an edge of a disk-shaped form in a generally radial direction), or other distance measurement. In some embodiments, a volume void fraction may be a function of a distance parameter over a plurality of electroactive elements, for example including a plurality of electroactive elements having different mean void volume fractions (optionally having an appreciable internal variation of void volume fraction, or in some embodiments no appreciable internal variation of void volume fraction) arranged to obtain a desired variation of void volume fraction with distance across a plurality of electroactive elements.

In some embodiments, a system includes at least one physical processor, a physical memory including computer-executable instructions that, when executed by the physical processor, cause the physical processor to apply an electrical field across an electroactive device to obtain non-uniform actuation based on a non-uniform distribution of voids within an electroactive element of the electroactive device. In some embodiments, a system includes at least one physical processor, a physical memory including computer-executable instructions that, when executed by the physical processor, cause the physical processor to receive an electrical signal from an electroactive device, and to process the electrical signal to obtain a deformation parameter of the electroactive device, wherein the deformation parameter includes one or more of the following: a magnitude of a deformation, a location of a deformation, a bend angle, a gesture type (e.g., selected from a plurality of gesture types). The analysis of the electrical signal may be based at least in part on a non-uniform distribution of voids within an electroactive element of the electroactive device.

In some embodiments, a non-transitory computer-readable medium includes one or more computer-executable instructions that, when executed by at least one processor of a computing device, cause the computing device to process an electrical signal received from an electroactive device to obtain a deformation parameter of the electroactive device, wherein the deformation parameter includes one or more of the following: a magnitude of a deformation, a location of a deformation, a bend angle, a gesture type (e.g., selected from a plurality of gesture types). The analysis of the electrical signal may be based on a non-uniform distribution of voids within an electroactive element of the electroactive device. In some embodiments, a non-transitory computer-readable medium includes one or more computer-executable instructions that, when executed by at least one processor of a computing device, cause the computing device to send an electrical signal to an electroactive device or electroactive system to obtain a non-uniform actuation, wherein the non-uniform actuation is based at least in part on a non-uniform distribution of voids within an electroactive element of the electroactive device.

Electroactive Elements

In some embodiments, the electroactive elements may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongates, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, a polymer element may include an elastomer. As used herein, an "elastomer" may refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, less than approximately 0.5). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, an electroactive element may include an elastomer material, which may have a Poisson's ratio of approximately 0.35 or less. In some embodiments, an electroactive element may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

An electroactive device may include a plurality of stacked layers, for example, each layer including an electroactive element disposed between a pair of electrodes. In some embodiments, an electrode may be shared between layers, for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the electroactive device.

Electroactive Polymers

An electroactive element may include one or more electroactive polymers, and may also include additional components. As used herein, "electroactive polymers" may refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications.

In some embodiments, an electroactive polymer may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance, in this case, is the change of strain with respect to stress or, equivalently, in more practical terms, the change in displacement with respect to force.

Voids

In some embodiments, an electroactive element may include voids, such as nanovoids (e.g., having a plurality of voids and/or nanoscale-sized voids in an electroactive element including an electroactive polymer or composite thereof). In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the electroactive elements. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm).

In some embodiments, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness of the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from the following expression: $D_{ratio}=D_{uncompressed}/D_{compressed}$, where $D_{ratio}$ may represent the effective density ratio, $D_{uncompressed}$ may represent the density of the uncompressed polymer, and $D_{compressed}$ may represent the density of the uncompressed polymer.

The density of voids within an electroactive element, or other dielectric material, may vary as a function of position. In some embodiments, the volume fraction of an electroactive component (or dielectric material) may vary between 10% and 60%. The structure of the voids may be interconnected (open cell) or the voids may be fully enclosed by suitable dielectric material (closed cell). The voids may be partially filled with a dielectric liquid or dielectric gas. The voids may be partially coated with a layer of suitable material. In some embodiments, a voided material (such as a porous material) may be fabricated using a templating agent, for example, a material that directs the structural formation of pores or other structural elements of an electroactive element. A templating agent may be any phase of matter (solid, liquid, gas). In some embodiments, a templating agent is removed to produce a pore (or void).

Particles

In some embodiments, an electroactive element may include particles including a material having a high dielectric constant, the particles having an average diameter between approximately 10 nm and approximately 1000 nm. In some embodiments, the material having the high dielectric constant may include barium titanate In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate ($BaTiO_3$), or other perovskite material such as other titanates.

Additionally or alternatively, any other suitable component may be added to the electroactive polymer material. $BaTiO_3$ is a ferroelectric material with a relatively high dielectric constant (e.g., a value of between approximately 500 and approximately 7000) and polarization and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, an electroactive device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, e.g., by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example, a dielectric liquid or a dielectric gas with high dielectric strength gas, such as a halide, in particular, a fluoride such as is sulfur hexafluoride, organofluoride or the like.

Electrodes

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode 115, or any other electrode) may include a metal such as aluminum, gold, silver, tin, copper, indium, gallium, zinc, and the like. An electrode may include one or more electrically conductive material, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, electroactive devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, e.g., through a contact layer, to a common electrode. In some embodiments, an electroactive device may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), e.g., a second electrode and a third electrode located either side of a first electrode. In some embodiments, an electroactive device may include additional electroactive elements interleaved between electrodes, for example in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, an electroactive device may include more (e.g., two, three, or more) such additional electroactive elements and corresponding electrodes. For example, an electroactive device may include a stack of two or more electroactive elements and corresponding electrodes. For example, an electroactive device may include between 2 electroactive elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements.

In some embodiments, electrodes may be flexible and/or resilient and may stretch, for example elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where electroactive devices have electroactive elements including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape or may be a more complex shape (e.g., patterned or freeform). In some embodiments, a common electrode may be shaped to allow compression and expansion of an electroactive device during operation.

Electrode Fabrication

In some embodiments, an electrode (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example, a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

Lens Assemblies and Optical Systems

In some embodiments, an electroactive device may include or be mechanically coupled to one or more optical elements. An optical element may include a lens, mirror, prism, holographic element, beam splitter, optical filter, diffraction grating, or other optical element. In some embodiments, an electroactive device, such as an actuator, may include or be mechanically coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In some embodiments, an electroactive device may include one or more direct-drive benders, that may include an electroactive element that is disposed between two electrodes. In such examples, methods of forming an electroactive device may involve forming electrodes and an electroactive polymer simultaneously (e.g., via coflowing, slot die coating, etc.).

In some embodiment, a lens assembly may include multiple deformable optical elements (e.g., multiple deformable lenses, such as liquid lenses), where the deformation is provided by one or more electroactive devices, in accordance with example embodiments of the disclosure.

Methods of Device Fabrication

Various fabrication methods are discussed below. Properties of the electroactive element may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an electroactive element.

Methods of forming an electroactive device include forming electrodes and electroactive elements sequentially (e.g., via vapor deposition, coating, printing, etc.) or simultaneously (e.g., via co-flowing, coextrusion, slot die coating, etc.). Alternatively, the electroactive elements may be deposited using initiated chemical vapor deposition (iCVD), where, for example, suitable monomers of the desired polymers may be used to form the desired coating. In some embodiments, monomers, oligomers, and/or prepolymers for forming the electroactive elements may optionally be mixed with a solvent and the solvent may be removed from the electroactive element during and/or following curing to form nanovoids within the electroactive element.

A method of fabricating an electroactive device may include depositing a curable material onto a first electrode, curing the deposited curable material to form an electroactive element, e.g., including a cured elastomer material, and depositing an electrically conductive material onto a surface of the electroactive element opposite the first electrode to form a second electrode. In some embodiments, the cured elastomer material may have a Poisson's ratio of approximately 0.35 or less. In some embodiments, a method may further include depositing an additional curable material onto a surface of the second electrode opposite the electroactive element, curing the deposited additional curable material to form a second electroactive element including a second cured elastomer material, and depositing an additional electrically conductive material onto a surface of the second electroactive element opposite the second electrode to form a third electrode.

In some embodiments, a method of fabricating an electroactive element may include vaporizing a curable material, or a precursor thereof, where depositing the curable material may include depositing the vaporized curable material onto the first electrode. In some embodiments, a method of fabricating an electroactive element may include printing the polymer or precursor thereof (such as a curable material) onto an electrode. In some embodiments, a method may also include combining a polymer precursor material with at least one other component to form a deposition mixture. In some embodiments, a method may include combining a curable material with particles of a material having a high dielectric constant to form a deposition mixture.

According to some embodiments, a method may include positioning a curable material between a first electrically conductive material and a second electrically conductive material. The positioned curable material may be cured to form an electroactive element including a cured elastomer material. In some embodiments, the cured elastomer material may have a Poisson's ratio of approximately 0.35 or less. In some embodiments, at least one of the first electrically conductive material or the second electrically conductive material may include a curable electrically conductive material, and the method may further include curing the at least one of the first electrically conductive material or the second electrically conductive material to form an electrode. In this example, curing the at least one of the first electrically conductive material or the second electrically conductive material may include curing the at least one of the first electrically conductive material or the second electrically conductive material during curing of the positioned curable material.

In some embodiments, a curable material and at least one of a first electrically conductive material or a second electrically conductive material may be flowable during positioning of the curable material between the first and second electrodes. A method of fabricating an electroactive device may further include flowing a curable material and at least one of the first electrically conductive material or the second electrically conductive material simultaneously onto a substrate.

In some embodiments, methods for fabricating an electroactive device (e.g., an actuator) may include masks (e.g., shadow masks) to control the patterns of deposited materials to form the electroactive device. In some embodiments, the electroactive device may be fabricated on a surface enclosed by a deposition chamber, which may be evacuated (e.g., using one or more mechanical vacuum pumps to a predetermined level such as $10^{-6}$ Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials (e.g., electrodes, polymer elements, and the like) that are mechanically coupled to the surface. In some embodiments, the surface may be fixed and the deposition and curing systems may move relative to the surface, or both the surface, the deposition, and/or curing systems may be moving simultaneously.

In some embodiments, an electroactive device (e.g., an actuator, sensor, or the like) may be fabricated by: providing an electrically conductive layer (e.g., a first electrode) having a first surface; depositing (e.g., vapor depositing) a polymer (e.g., an electroactive polymer) or polymer precursor (such as a monomer) onto the electrode; as needed, forming a polymer such as an electroactive polymer from the polymer precursor (e.g., by curing or a similar process); and depositing another electrically conductive layer (e.g., a second electrode) onto the electroactive polymer. In some embodiments, the method may further include repeating one or more of the above to fabricate additional layers (e.g., second electroactive element, other electrodes, an alternating stack of polymer layers and electrodes, and the like. An electroactive device may have a stacked configuration.

In some embodiments, an electroactive device may be fabricated by first depositing a first electrode, and then depositing a curable material (e.g., a monomer) on the first electrode (e.g., deposited using a vapor deposition process). In some embodiments, an inlet (not shown) to a deposition chamber may open and may input an appropriate monomer initiator for starting a chemical reaction. In some embodiments, "monomer," as used herein, may refer to a monomer that forms a given polymer (i.e., as part of an electroactive element). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable material may be cured with a source of radiation (e.g., electromagnetic radiation, such as UV and/or visible light) to form an electroactive element that includes a cured elastomer material, for example by photopolymerization. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form an electroactive element. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured elastomer material may include at least one non-polymeric component in a plurality of defined regions and the method may further include removing at least a portion of the at least one non-polymeric component from the cured elastomer material to form a voided (e.g., nanovoided) polymer element.

An electrically conductive material then be deposited onto a surface of the first electroactive element opposite a first electrode to form a second electrode. An additional curable material may be deposited onto a surface of the second electrode opposite the electroactive element. For example, the deposited additional curable material may be cured to form a second electroactive element, for example including a second cured elastomer material. In some embodiments, an additional electrically conductive material may be deposited onto a surface of the second electroactive element opposite the second electrode to form a third electrode.

In some embodiments, a deposition chamber may have an exhaust port configured to open to release at least a portion of the vapor in the chamber during and/or between one or more depositions of the materials (e.g., monomers, oligomers, monomer initiators, conductive materials, etc.). In some embodiments, a deposition chamber may be purged (e.g., with a gas or the application of a vacuum, or both), to remove a portion of the vapor (e.g., monomers, oligomers, monomer initiators, metal particles, and any resultant by-products). Thereafter one or more of the previous steps may be repeated (e.g., for a second electroactive element, and the like). In this way, individual layers of an electroactive device may be maintained at high purity levels.

In some embodiments, the deposition of the materials (e.g., monomers, oligomers, monomer initiators, conductive materials, etc.) of the electroactive device may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more electrodes, electroactive polymers, etc.). Frequently, volatile by-products are also produced, which may be removed by gas flow through the chamber.

In some embodiments, an electroactive device may be fabricated using an atmospheric pressure CVD (APCVD) coating formation technique (e.g., CVD at atmospheric pressure). In some embodiments, an electroactive device may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately $10^{-6}$ Pa (equivalently, approximately $10^{-8}$ torr)).

In some embodiments, an electroactive device may be fabricated using an aerosol-assisted CVD (AACVD) process (e.g., a CVD in which the precursors are transported to the electroactive device) by means of a liquid/gas aerosol, which may be generated ultrasonically or with electrospray. In some embodiments, AACVD may be used with non-volatile precursors. In some embodiments, an electroactive device may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to the electroactive device as in CVD. DLICVD may be used on liquid or solid precursors, and high growth rates for the deposited materials may be reached using this technique.

In some embodiments, an electroactive device may be fabricated using a hot wall CVD process (e.g., CVD in which the deposition chamber is heated by an external power source and the electroactive device is heated by radiation from the heated wall of the deposition chamber). In another aspect, an electroactive device may be fabricated using a cold wall CVD process (e.g., a CVD in which only the electroactive device is directly heated, for example, by induction, while the walls of the chamber are maintained at room temperature).

In some embodiments, an electroactive device may be fabricated using a microwave plasma-assisted CVD (MPCVD) process, where microwaves are used to enhance chemical reaction rates of the precursors. In another aspect, an electroactive device may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the electroactive device or in depositing certain materials (e.g., organic materials and/or some polymers).

In some embodiments, an electroactive device may be fabricated using a remote plasma-enhanced CVD (RPECVD) process. In some embodiments, RPECVD may be similar to PECVD except that the electroactive device may not be directly in the plasma discharge region. In some embodiments, the removal of the electroactive device from the plasma region may allow for the reduction of processing temperatures down to room temperature.

In some embodiments, an electroactive device may be fabricated using an atomic-layer CVD (ALCVD) process. In some embodiments, ALCVD may deposit successive layers of different substances to produce layered, crystalline film coatings on the electroactive device.

In some embodiments, an electroactive device may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the electroactive device.

In some embodiments, an electroactive device may be fabricated using a hot filament CVD (HFCVD) process, which may also be referred to as catalytic CVD (cat-CVD) or initiated CVD (iCVD). In some embodiments, this process may use a hot filament to chemically decompose the source gases to form the materials of the electroactive device. Moreover, the filament temperature and temperature of portions of the electroactive device may be independently controlled, allowing colder temperatures for better adsorption rates at the electroactive device, and higher temperatures necessary for decomposition of precursors to free radicals at the filament.

In some embodiments, an electroactive device may be fabricated using a hybrid physical-chemical vapor deposition (HPCVD) process. HPCVD may involve both chemical decomposition of precursor gas and vaporization of a solid source to form the materials on the electroactive device.

In some embodiments, an electroactive device may be fabricated using metalorganic chemical vapor deposition (MOCVD) process (e.g., a CVD that uses metalorganic precursors) to form materials on the electroactive device. For example, an electrode may be formed on an electroactive element using this approach.

In some embodiments, an electroactive device may be fabricated using a rapid thermal CVD (RTCVD) process. This CVD process uses heating lamps or other methods to rapidly heat the electroactive device. Heating only the electroactive device rather than the precursors or chamber walls may reduce unwanted gas-phase reactions that may lead to particle formation in the electroactive device.

In some embodiments, an electroactive device may be fabricated using a photo-initiated CVD (PICVD) process. This process may use UV light to stimulate chemical reactions in the precursor materials used to make the materials for the electroactive device. Under certain conditions, PICVD may be operated at or near atmospheric pressure.

In some embodiments, electroactive devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, the flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component, for example, on an electrode (e.g., a first electrode or a second electrode) of the electroactive device. Alternatively, the flowable material (e.g., solvent) may be introduced into a vaporizer to deposit (e.g., via vaporization or, in alternative embodiments, via printing) a curable material onto an electrode. In some embodiments, a flowable material (e.g., solvent) may be deposited as a separate layer either on top or below a curable material (e.g., a monomer) and the solvent and curable material may be allowed to diffuse into each other before being cured by the source of radiation to generate an electroactive polymer having nanovoids. In some embodiments, after the curable material is cured, the solvent may be allowed to evaporate before another electroactive polymer or another electrode is formed. In some embodiments, the evaporation of the solvent may be accelerated by the application of heat to the surface with a heater, which may, for example, be disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated electroactive polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers, and may at least partially phase separate when condensed on the substrate.

In some embodiments, there may be multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (for example SPAN 80, available from Sigma-Aldrich Company). In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

As discussed throughout the instant disclosure, the disclosed devices, systems, and methods may provide one or more advantages over conventional devices, systems, and methods. For example, in contrast to prior devices, electroactive devices presented herein may include electroactive elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, an electroactive device may be formed in a stacked structure having a plurality of electroactive elements that are layered with multiple electrodes, enabling the plurality of electroactive elements to be actuated in conjunction with each other in a single device that may undergo a more substantial degree of deformation (e.g., compression and/or expansion) in comparison to an electroactive device having a single electroactive element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) as described herein to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some embodiments, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some embodiments, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments, one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive [data] to be transformed, transform the [data], output a result of the transformation to [perform a function], use the result of the transformation to [perform a function], and store the result of the transformation to [perform a function]. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An electroactive device comprising:
a first electrode;
a second electrode; and
an electroactive element disposed between the first electrode and the second electrode,
wherein:
the electroactive element comprises an electroactive polymer and a plurality of gas-filled voids distributed within the electroactive polymer,
the plurality of gas-filled voids has a non-uniform distribution within the electroactive polymer, and
the electroactive element has a non-uniform electroactive response when an electrical signal is applied between the first electrode and the second electrode, based on the non-uniform distribution of gas-filled voids.

2. The electroactive device of claim 1, wherein the non-uniform distribution of the plurality of gas-filled voids includes a spatial variation in at least one of void diameter, void volume, void number density, void volume fraction, or void orientation.

3. The electroactive device of claim 1, wherein the plurality of gas-filled voids includes voids comprising air.

4. The electroactive device of claim 1, wherein the non-uniform electroactive response includes a first deformation of a first portion of the electroactive element that differs from a second deformation of a second portion of the electroactive element.

5. The electroactive device of claim 1, wherein the electroactive device has a predetermined first deformation on application of a first voltage between the first and second electrodes and a predetermined second deformation on application of a second voltage between the first and second electrodes.

6. The electroactive device of claim 1, wherein the electrical signal includes a potential difference, which induces a non-uniform constriction of the electroactive element between the first and second electrodes.

7. The electroactive device of claim 1, wherein the non-uniform electroactive response includes a curvature of a surface of the electroactive element.

8. The electroactive device of claim 1, wherein:
the electroactive device further comprises an optical element mechanically coupled to the electroactive element, and
the optical element includes at least one of a lens, a grating, a prism, a mirror, or a diffraction grating.

9. The electroactive device of claim 1, wherein the electroactive device is a component of a wearable device.

10. The electroactive device of claim 9, wherein the wearable device comprises a helmet, an eyewear frame, a glove, or a belt.

11. The electroactive device of claim 9, wherein the wearable device is configured to support the electroactive device proximate a user when the user wears the wearable device, and the electroactive device is configured to provide a tactile signal to the user.

12. An electroactive device comprising:
a first electrode;
a second electrode; and
an electroactive element disposed between the first electrode and the second electrode,
wherein:
the electroactive element comprises an electroactive polymer and a plurality of gas-filled voids distributed within the electroactive element,
the plurality of gas-filled voids has a non-uniform distribution within the electroactive element,
application of a mechanical input to a portion of the electroactive element generates an electric signal between the first electrode and the second electrode, and
the electrical signal has a magnitude determined, at least in part, by the location of the mechanical input relative to the non-uniform distribution of gas-filled voids within the electroactive element.

13. The electroactive device of claim 12, wherein:
the electroactive element includes a first portion and a second portion, and
a first voltage generated by a mechanical input to the first portion is appreciably different from a second voltage generated by a similar mechanical input to the second portion.

14. The electroactive device of claim 12, wherein the electroactive device is a component of a wearable device, wherein:
the wearable device is configured to be worn by a user, and
the wearable device is configured to support the electroactive device against a body portion of the user.

15. The electroactive device of claim 14, wherein the electroactive device is configured to provide an electrical signal correlated with a configuration of the body part.

16. The electroactive device of claim 14, wherein
the wearable device is a glove, and
the electroactive device is configured to provide an electrical signal based, at least in part, on a joint angle within a hand of the user.

17. A method comprising:
generating an electroactive response in an electroactive device, the electroactive device including an electroactive element located between a first electrode and a second electrode,
wherein the electroactive response to an electrical input or a mechanical input varies appreciably over a spatial extent of the electroactive device due to a non-uniform distribution of gas-filled voids within the electroactive element.

18. The method of claim 17, wherein the electroactive response comprises a mechanical response to the electrical input that varies over the spatial extent of the electroactive device, the electrical input being applied between the first electrode and the second electrode.

19. The method of claim 17, wherein the electroactive response comprises an electrical signal having a characteristic indicative of a location of the mechanical input to the electroactive device, the electrical signal being measured between the first electrode and the second electrode.

20. The method of claim 19, wherein:
the electroactive device is supported against a hand of a user, and
the electrical signal is used to determine a gesture by the user, the gesture including a finger movement.

* * * * *